(12) United States Patent
Inoue et al.

(10) Patent No.: US 11,581,246 B2
(45) Date of Patent: Feb. 14, 2023

(54) SEMICONDUCTOR DEVICE PACKAGE AND SEMICONDUCTOR DEVICE

(71) Applicant: SUMITOMO ELECTRIC DEVICE INNOVATIONS, INC., Kanagawa (JP)

(72) Inventors: Shingo Inoue, Yokohama (JP); Kaname Ebihara, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 101 days.

(21) Appl. No.: 17/292,656

(22) PCT Filed: Feb. 13, 2020

(86) PCT No.: PCT/JP2020/005628
§ 371 (c)(1),
(2) Date: May 10, 2021

(87) PCT Pub. No.: WO2020/166669
PCT Pub. Date: Aug. 20, 2020

(65) Prior Publication Data
US 2022/0005751 A1    Jan. 6, 2022

(30) Foreign Application Priority Data
Feb. 14, 2019  (JP) .............................. JP2019-024289

(51) Int. Cl.
*H01L 23/495*  (2006.01)
*H01L 23/00*  (2006.01)
(52) U.S. Cl.
CPC .. *H01L 23/49517* (2013.01); *H01L 23/49579* (2013.01); *H01L 24/48* (2013.01); *H01L 2224/48245* (2013.01)

(58) Field of Classification Search
CPC .................................................. H01L 23/49517
USPC ......................................................... 257/741
See application file for complete search history.

(56) References Cited

U.S. PATENT DOCUMENTS

| 4,881,116 A | 11/1989 | Hidada | |
|---|---|---|---|
| 2014/0209349 A1* | 7/2014 | Sagawa | H01B 1/026 174/126.2 |

FOREIGN PATENT DOCUMENTS

| JP | S63-107055 | 5/1988 |
|---|---|---|
| JP | H10-163353 | 6/1998 |
| JP | H11-233697 | 8/1999 |
| JP | 2000-236034 | 8/2000 |

(Continued)

*Primary Examiner* — Ajay Arora
(74) *Attorney, Agent, or Firm* — Smith, Gambrell & Russell, LLP.

(57) ABSTRACT

A semiconductor device package is disclosed. The package according to one example includes a base having a main surface made of a metal, a dielectric side wall having a bottom surface facing the main surface, a joining material containing silver (Ag) and joining the main surface of the base and the bottom surface of the side wall to each other, a lead made of a metal joined to an upper surface of the side wall on a side opposite to the bottom surface, and a conductive layer not containing silver (Ag). The conductive layer is provided between the bottom surface and the upper surface of the side wall at a position overlapping the lead when viewed from a normal direction of the main surface. The conductive layer is electrically connected to the joining material, extends along the bottom surface, and is exposed from a lateral surface of the side wall.

16 Claims, 22 Drawing Sheets

(56) References Cited

FOREIGN PATENT DOCUMENTS

| JP | 2000236034 A | * | 8/2000 |
|----|--------------|---|--------|
| JP | 2005-268333  |   | 9/2005 |
| JP | 2007-243145  |   | 9/2007 |
| JP | 2011-165931  |   | 8/2011 |
| JP | 2015-204426  |   | 11/2015 |

* cited by examiner

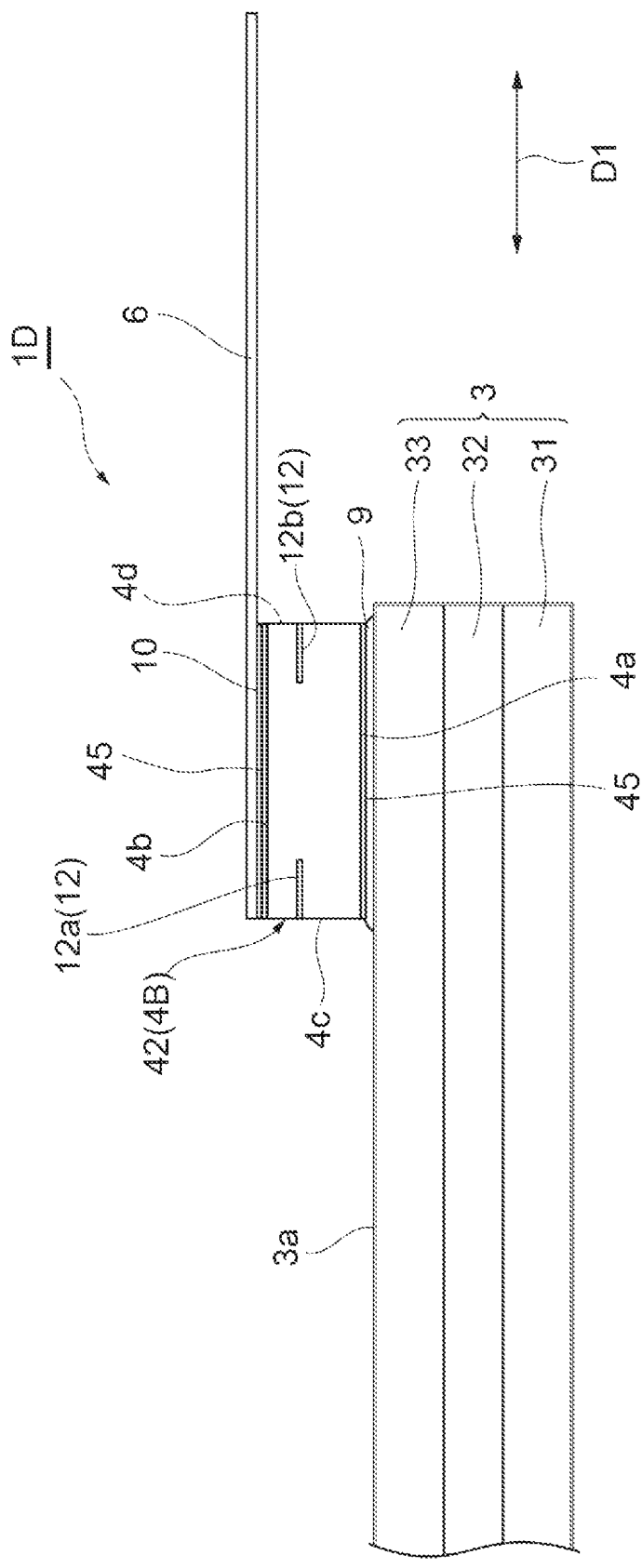

Fig.18A
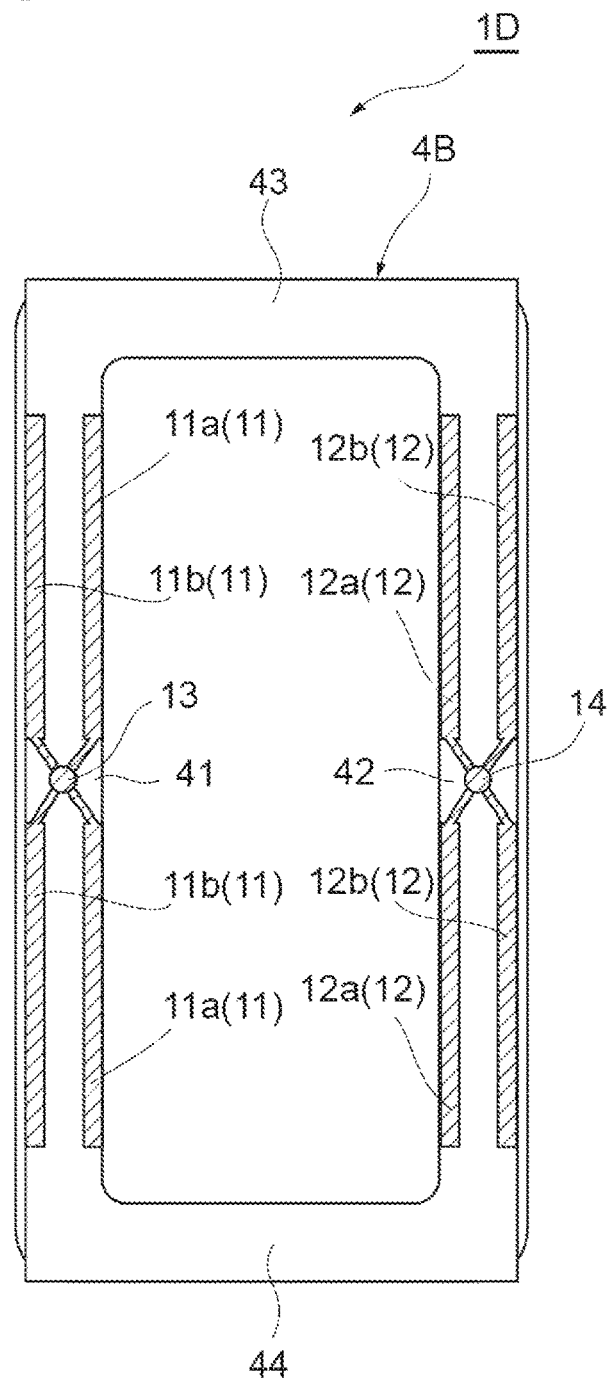
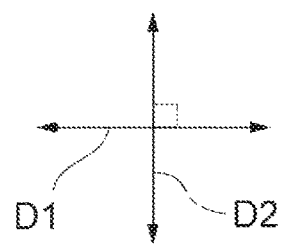

Fig.18B
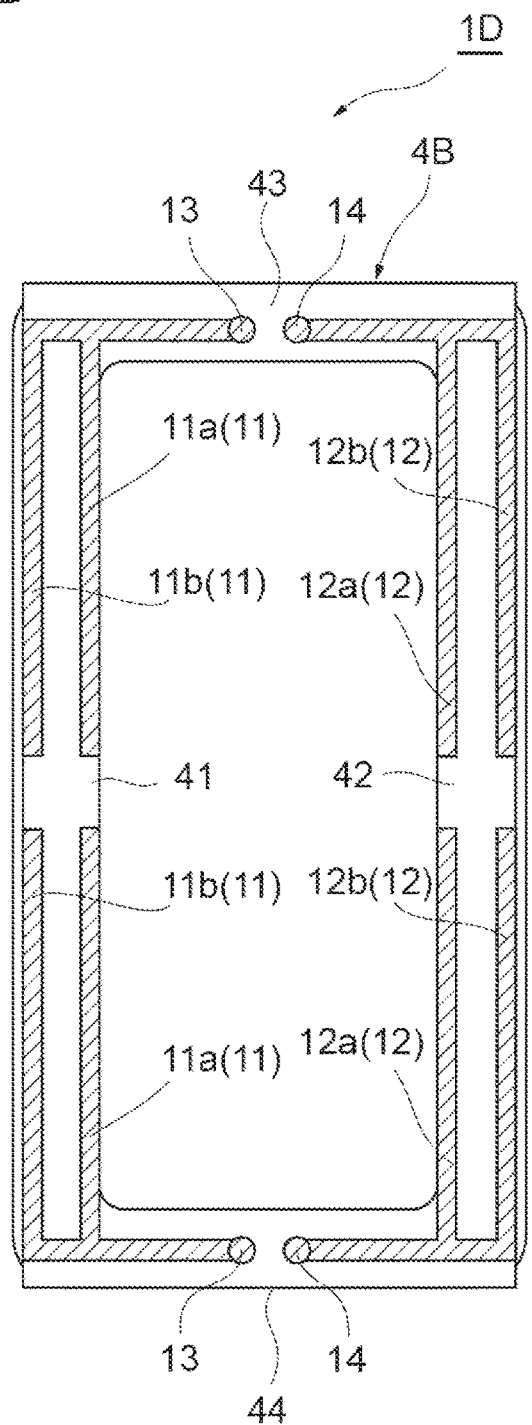
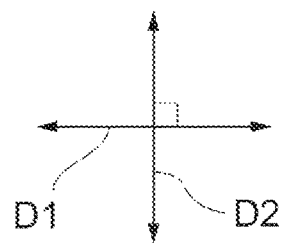

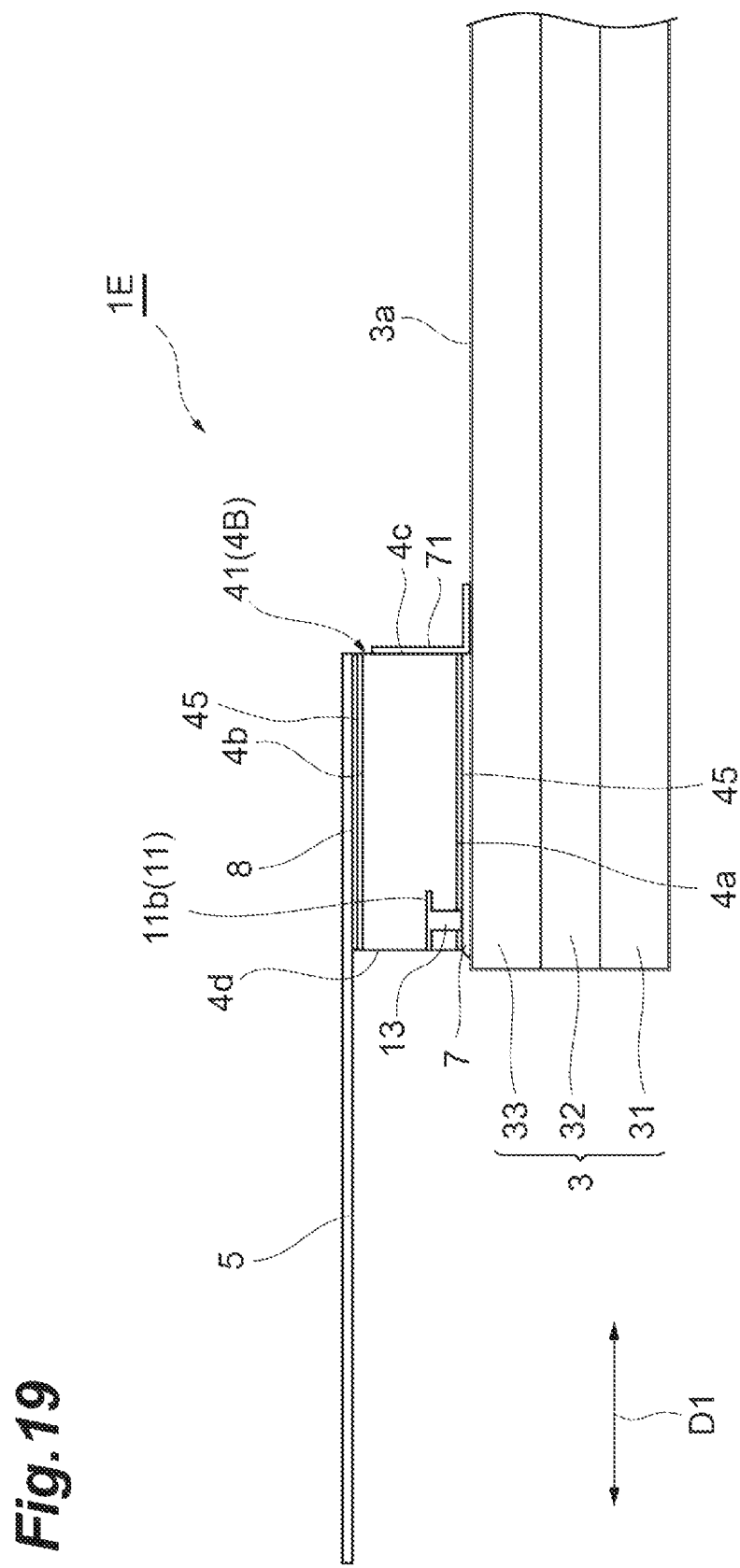

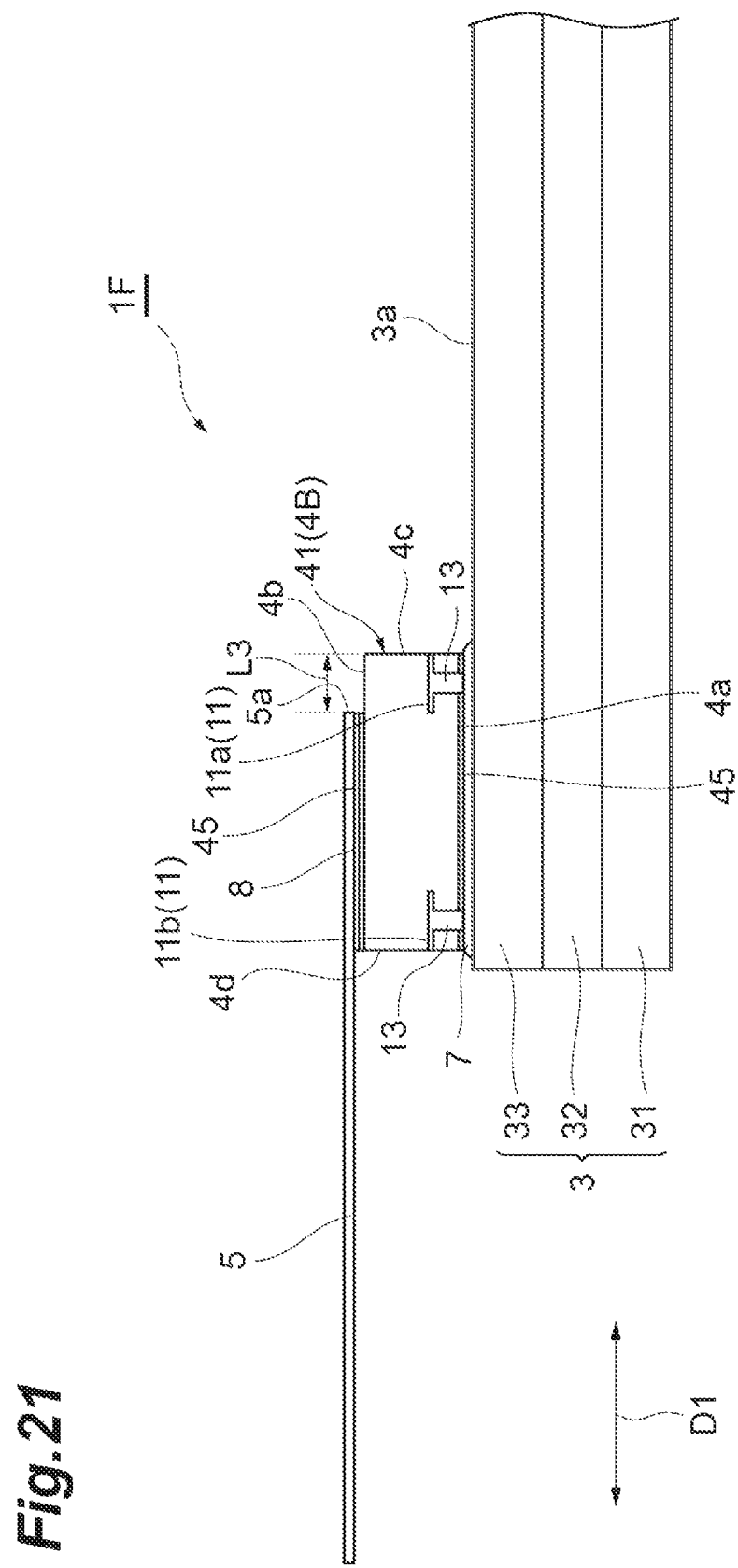

SEMICONDUCTOR DEVICE PACKAGE AND SEMICONDUCTOR DEVICE

TECHNICAL FIELD

The present disclosure relates to a semiconductor device package and a semiconductor device.

This application is based upon and claims the benefit of priority from Japanese Patent Application No. 2019-024289, filed on Feb. 14, 2019, the entire contents of which are incorporated herein by reference.

BACKGROUND ART

Patent Literature 1 discloses a high-frequency circuit module. This module includes first and second printed circuit boards. A high-frequency component is mounted on the first printed circuit board. A recess that is surrounded by a wall surface in which a plurality of conductor vias are embedded and a conductor layer of a surface layer or an inner layer are provided at a portion of the second printed circuit board facing a mounting region of the high-frequency component. Surface layer patterns of the first and second printed circuit boards facing each other are electrically connected by solder. The high-frequency component is accommodated in the recessed space of the second printed circuit board.

Patent Literature 2 discloses a package for a microwave device. This package includes base metal serving as a ground electrode and a three-layer ceramic layer provided on the base metal. A ground conductive pattern for a microstrip line is provided in a lowermost layer of the ceramic layer. A line conductive pattern for electrically connecting an external circuit and a semiconductor chip is provided in an intermediate layer of the ceramic layer. A ground conductive pattern connected to the base metal is provided in an uppermost layer of the ceramic layer. In the vicinity of a region in which a lead terminal is formed, the ground conductive pattern in the lowermost layer of the ceramic layer is not exposed from a lamination end portion.

CITATION LIST

Patent Literature

[Patent Literature 1] Japanese Unexamined Patent Publication No. 2011-165931
[Patent Literature 2] Japanese Unexamined Patent Publication No. H10-163353

SUMMARY OF INVENTION

The present disclosure provides a semiconductor device package according to one aspect. This semiconductor device package includes a base having a main surface made of a metal, a dielectric side wall having a bottom surface facing the main surface, a joining material containing silver (Ag) and joining the main surface of the base and the bottom surface of the side wall to each other, a lead made of a metal joined to an upper surface of the side wall on a side opposite to the bottom surface, and a conductive layer not containing silver (Ag). The conductive layer is provided between the bottom surface and the upper surface of the side wall at a position overlapping the lead when viewed from a normal direction of the main surface. The conductive layer is electrically connected to the joining material, extends along the bottom surface, and is exposed from a lateral surface of the side wall.

The present disclosure provides a semiconductor device according to one aspect. This semiconductor device includes the package described above, and a semiconductor element mounted in the package. The lead is electrically connected to the semiconductor element via wiring in the package. A potential of the lead is lower than a potential of the main surface of the base.

The present disclosure provides a semiconductor device package according to another aspect. This semiconductor device package according to another aspect includes a base having a main surface made of a metal, a dielectric side wall having a bottom surface joined to the main surface, a lead made of a metal facing an upper surface of the side wall on a side opposite to the bottom surface, a joining material containing silver (Ag) and joining the lead and the upper surface of the side wall to each other, and a conductive layer not containing silver (Ag). The conductive layer is provided between the bottom surface and the upper surface of the side wall at a position overlapping the lead when viewed from a normal direction of the main surface. The conductive layer is electrically connected to the joining material, extends along the upper surface, and is exposed from a lateral surface of the side wall.

The present disclosure provides a semiconductor device according to another aspect. The semiconductor device according to another aspect includes the above-described package according to another aspect, and a semiconductor element mounted in the package. The lead is electrically connected to the semiconductor element via wiring in the package. A potential of the lead is higher than a potential of the main surface of the base.

BRIEF DESCRIPTION OF DRAWINGS

FIG. 17 is a view schematically illustrating a cross section including an output lead of the semiconductor device package according to the third modified example.

FIG. 18A is a view illustrating a disposition of conductive layers and vias in the third modified example and schematically illustrates a state in which the conductive layers and the vias are viewed from a normal direction of a main surface of a base.

FIG. 18B is a view illustrating a disposition of the conductive layers and the vias in the third modified example and schematically illustrates a state in which the conductive layers and the vias are viewed from a normal direction of a main surface of a base.

FIG. 19 is a view schematically illustrating a cross section including an input lead of a semiconductor device package according to a fourth modified example.

FIG. 21 is a view schematically illustrating a cross section including an input lead of a semiconductor device package according to a fifth modified example.

DESCRIPTION OF EMBODIMENTS

Problems to be Solved by Disclosure

Figure 1:
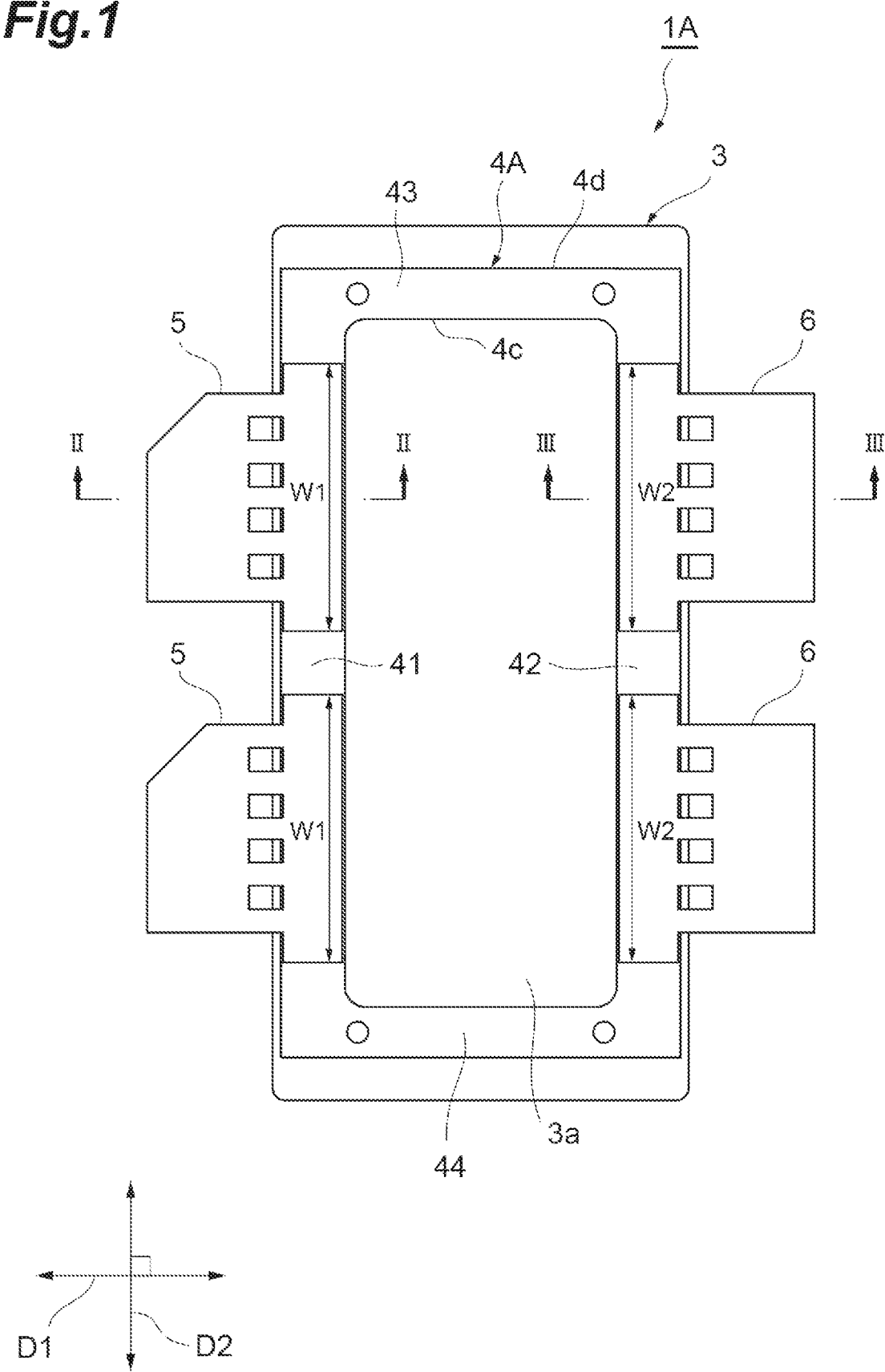
FIG. 1 is a plan view of a semiconductor device package according to one embodiment.

For example, in a semiconductor device for a high-frequency application, a package for hermetically sealing a semiconductor element is used. The package includes a base having a main surface made of a metal, a dielectric side wall having a bottom surface joined to the main surface of the base, and a lead made of a metal joined to an upper surface of the side wall on a side opposite the bottom surface. In at least one of joining between the main surface of the base and the bottom surface of the side wall and joining between the upper surface of the side wall and the lead, a joining material containing silver (Ag) (for example, silver brazing material, sintered type silver paste, or the like) may be used. A joining material containing Ag has higher reliability than solder or the like.

However, when a joining material containing Ag is used, the following problems arise. The main surface of the base is often defined by a ground potential (ground potential). Also, various voltages such as a bias voltage to the semiconductor element are applied to the lead. Accordingly, an electric field is generated between the main surface of the base and the lead. In a humid environment, ion migration (a phenomenon in which ionized metals move on a surface of a substance between electric fields) occurs easily due to the above-described electric field. Metal ions move by being attracted by the electric field, return from the ionized state to a metal for certain reasons, then accumulate, and thereby dendrites (dendron) are formed. When dendrites of Ag grow from the above-described joining material containing Ag and cause short-circuiting between the lead and the main surface of the base, this leads to a failure of the semiconductor device. Further, the dendrites of Ag grow from a high potential side to a low potential side. Therefore, when a potential of the lead is lower than a potential of the main surface of the base (for example, when the lead provides a negative gate bias), the dendrites of Ag grow from the joining material between the base and the sidewall toward the lead. When a potential of the lead is higher than a potential of the main surface of the base (for example, when the lead provides a positive drain bias), the dendrites of Ag grow from the joining material between the lead and the sidewall toward the base.

Advantageous Effects of Invention

According to the present disclosure, short-circuiting between the main surface of the base and the lead due to dendrites of Ag contained in the joining material of the semiconductor device package can be reduced.

Solution to Problem

First, details of an embodiment of the present disclosure will be listed and described. A semiconductor device package according to one embodiment includes a base having a main surface made of a metal, a dielectric side wall having a bottom surface facing the main surface, a joining material containing silver (Ag) and joining the main surface of the base and the bottom surface of the side wall to each other, a lead made of a metal joined to an upper surface of the side wall on a side opposite to the bottom surface, and a conductive layer not containing silver (Ag). The conductive layer is provided between the bottom surface and the upper surface of the side wall at a position overlapping the lead when viewed from a normal direction of the main surface. The conductive layer is electrically connected to the joining material, extends along the bottom surface, and is exposed from a lateral surface of the side wall.

The semiconductor device according to one embodiment includes the package according to the above-described embodiment, and a semiconductor element mounted in the package. The lead is electrically connected to the semiconductor element via wiring in the package. A potential of the lead is lower than a potential of the main surface of the base.

A semiconductor device package according to another embodiment includes a base having a main surface made of a metal, a dielectric side wall having a bottom surface joined to the main surface, a lead made of a metal facing an upper surface of the side wall on a side opposite to the bottom surface, a joining material containing silver (Ag) and joining the lead and the upper surface of the side wall to each other, and a conductive layer not containing silver (Ag). The conductive layer is provided between the bottom surface and the upper surface of the side wall at a position overlapping the lead when viewed from a normal direction of the main surface. The conductive layer is electrically connected to the joining material, extends along the upper surface, and is exposed from a lateral surface of the side wall. The configuration of the semiconductor device package according to this another embodiment and the configuration of the semiconductor device package according to the above-described one embodiment can be applied to one semiconductor device package.

The semiconductor device according to another embodiment includes the package according to the above-described another embodiment, and a semiconductor element mounted in the package. The lead is electrically connected to the semiconductor element via wiring in the package. A potential of the lead is higher than a potential of the main surface of the base. The configuration of the semiconductor device according to this another embodiment and the configuration of the semiconductor device according to the above-described one embodiment can be applied to one semiconductor device.

As one embodiment, in the package or semiconductor device according to any one of the above-described embodiments, electrical connection between the conductive layer and the joining material may be performed by a conductive via penetrating the side wall between the conductive layer and the joining material.

As one embodiment, in the package or semiconductor device according to any one of the above-described embodiments, a distance between a surface of the side wall joined to the joining material and the conductive layer may be smaller than a distance between a surface of the side wall on a side opposite to the surface joined to the joining material and the conductive layer.

As one embodiment, in the package or semiconductor device according to any one of the above-described embodiments, the dielectric may be a ceramic, and the conductive layer may have a laminated structure including a tungsten (W) layer and a nickel (Ni) layer.

As one embodiment, in the package or semiconductor device according to any one of the above-described embodiments, the dielectric may be a resin, and the conductive layer may have a laminated structure including a copper (Cu) layer and a gold (Au) layer or a nickel (Ni) layer.

As one embodiment, in the package or semiconductor device according to any one of the above-described embodiments, the conductive layer may include at least one of a first portion provided to be biased toward an inner lateral surface of the side wall and exposed from the inner lateral surface, and a second portion provided to be biased toward an outer lateral surface of the side wall and exposed from the outer lateral surface. In this case, the conductive layer may include only the second portion.

DETAILED DESCRIPTION OF EMBODIMENTS OF DISCLOSURE

Specific examples of a semiconductor device package and a semiconductor device according to one embodiment of the present disclosure will be described below with reference to the drawings. The present invention is not limited to these examples and is defined by the scope of the claims, and meanings equivalent to the scope of the claims and all modifications are intended to be included within the scope. In the following description, the same elements will be assigned by the same reference signs in the description of the drawings, and duplicate description thereof will be omitted.

Figure 2:
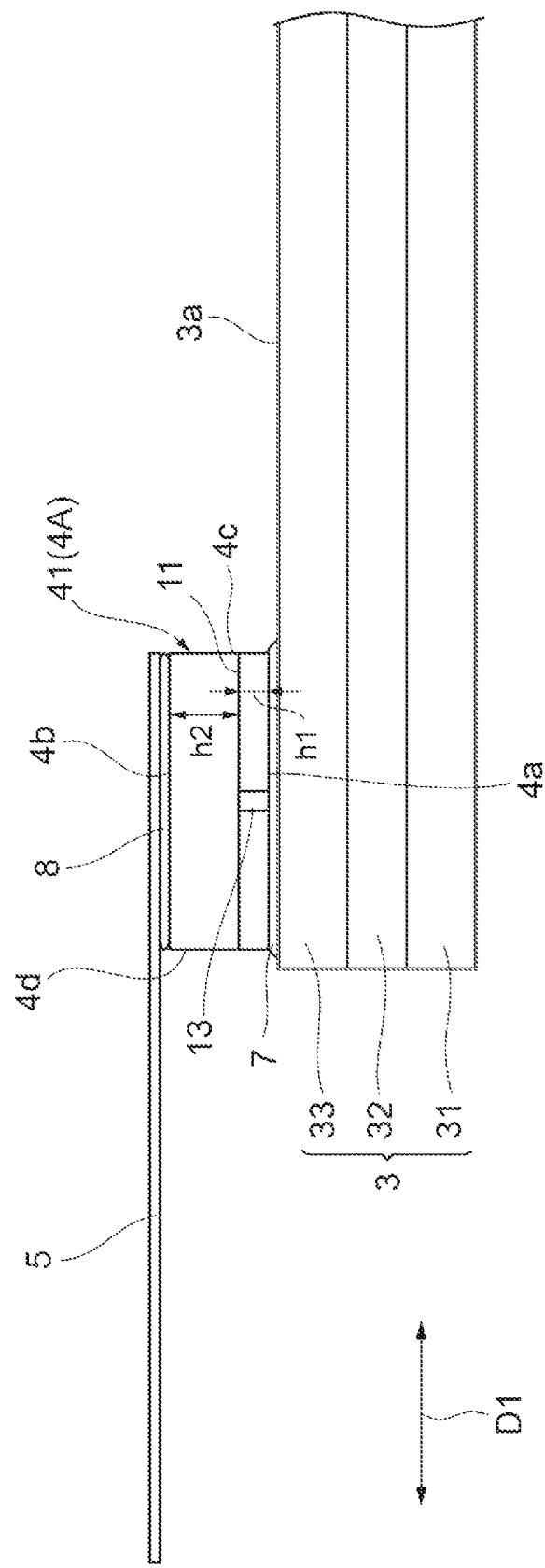
FIG. 2 is a view schematically illustrating a cross section of a part of the semiconductor device package along line II-II of FIG. 1.
Figure 3:
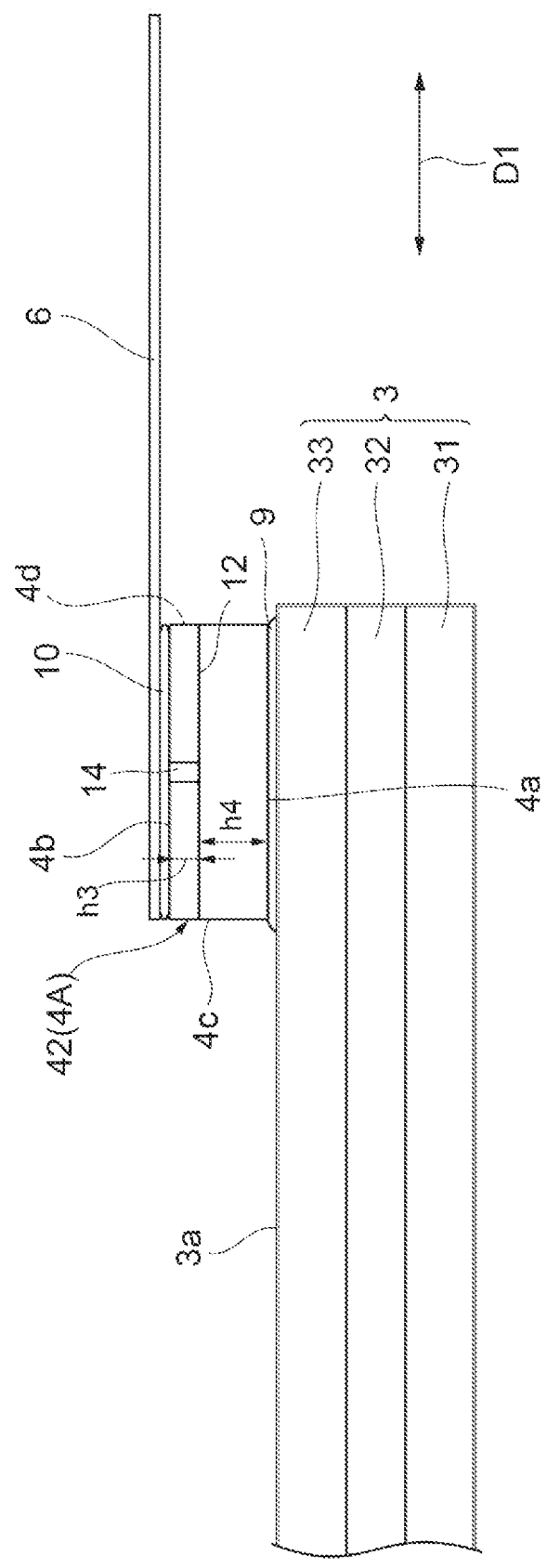
FIG. 3 is a view schematically illustrating a cross section of a part of the semiconductor device package along line III-III of FIG. 1.

FIG. 1 is a plan view of a semiconductor device package 1A according to one embodiment. FIG. 2 is a view schematically illustrating a cross section of the package 1A along line II-II of FIG. 1. FIG. 3 is a view schematically illustrating a cross section of the package 1A along line III-III of FIG. 1. As illustrated in FIGS. 1 to 3, the package 1A of the present embodiment includes a base 3, a side wall 4A, two input leads 5, two output leads 6, joining materials 7 to 10, conductive layers 11 and 12, a plurality of vias 13, and a plurality of vias 14.

The base 3 is a plate-shaped member having a flat main surface 3a made of a metal. The base 3 may be formed of a laminated material made of, for example, copper, an alloy of copper and molybdenum, an alloy of copper and tungsten, a copper plate, a molybdenum plate, a tungsten plate, an alloy plate of copper and molybdenum, or an alloy plate of copper and tungsten. In the example illustrated in FIGS. 2 and 3, the base 3 has a structure in which a molybdenum plate 32 is sandwiched between two copper plates 31 and 33. A surface of a base material of the base 3 is plated with nickel chromium (nichrome)-gold, nickel-gold, nickel-palladium-gold, silver or nickel, nickel-palladium, or the like. Gold, silver, and palladium are plating materials, and NiCr, Ni, and the like are seed materials. Adhesion can be enhanced when a plating material and a seed material are contained compared to a case in which a plating material is used alone. A thickness of the base 3 may be, for example, 0.5 mm or more and 1.5 mm or less. A plan-view shape of the base 3 may be, for example, a rectangular shape.

The side wall 4A is a substantially rectangular frame-shaped member made of a ceramic as a dielectric. As illustrated in FIG. 1, the side wall 4A includes a pair of portions 41 and 42 facing each other in a direction D1 along the main surface 3a of the base 3, and a pair of portions 43 and 44 facing each other in a direction D2 intersecting (for example, perpendicular to) the direction D1. The portions 41 and 42 extend along the direction D2 in parallel to each other, and the portions 43 and 44 extend along the direction D1 in parallel to each other. In the following description, the portion 41 may also be referred to as a side wall portion on an input side, and the portion 42 may also be referred to as a side wall portion on an output side. A cross section of each of the portions 41 to 44 perpendicular to its extending direction has a rectangular shape or a square shape. A height of the side wall 4A in a normal direction of the main surface 3a may be, for example, 0.5 mm or more and 1.0 mm or less.

As illustrated in FIGS. 2 and 3, the side wall 4A includes a flat bottom surface 4a facing the main surface 3a of the base 3, and an upper surface 4b on a side opposite to the bottom surface 4a. Entire surfaces of the bottom surface 4a and the upper surface 4b are plated with nickel (Ni) after tungsten (W) is deposited. As illustrated in FIG. 2, the bottom surface 4a of the portion 41 is joined to the main surface 3a of the base 3 via the joining material 7. In other words, the joining material 7 joins the bottom surface 4a of the portion 41 and the main surface 3a of the base 3 to each other. As illustrated in FIG. 3, the bottom surface 4a of the portion 42 is joined to the main surface 3a of the base 3 via the joining material 9. In other words, the joining material 9 joins the bottom surface 4a of the portion 42 and the main surface 3a of the base 3 to each other. These joining materials 7 and 9 contain silver (Ag). As a joining material containing Ag, silver brazing material or other silver-based joining materials can be exemplified. In one example, the joining materials 7 and 9 are silver brazing material.

The input lead 5 and the output lead 6 are plate-shaped members made of a metal, and may be a thin metal plate made of, for example, copper, a copper alloy, or an iron alloy. One end portion of the input lead 5 in the direction D1 faces the upper surface 4b of the portion 41 of the side wall 4A. The input lead 5 is insulated from the main surface 3a of the base 3 by the portion 41 of the side wall 4A. As illustrated in FIG. 2, one end portion of the input lead 5 is joined to the upper surface 4b of the portion 41 via the joining material 8. In other words, the joining material 8 joins the upper surface 4b of the portion 41 and one end portion of the input lead 5 to each other. One end portion of the output lead 6 in the direction D1 faces the upper surface 4b of the portion 42 of the side wall 4A. The output lead 6 is insulated from the main surface 3a of the base 3 by the portion 42 of the side wall 4A. As illustrated in FIG. 3, one end portion of the output lead 6 is joined to the upper surface 4b of the portion 42 via the joining material 10. In other words, the joining material 10 joins the upper surface 4b of the portion 42 and one end portion of the output lead 6 to each other. These joining materials 8 and 10 also contain silver (Ag). In one example, the joining materials 8 and 10 are silver brazing material.

As illustrated in FIG. 2, the conductive layer 11 is a layer made of a conductive material embedded in the portion 41 of the side wall 4A, is provided between the bottom surface 4a and the upper surface 4b, and extends along the bottom surface 4a of the side wall 4A. The conductive layer 11 of the present embodiment is sandwiched between two dielectric layers constituting the portion 41. The conductive layer 11 is provided at a position overlapping the input lead 5 in the portion 41 when viewed at least in the normal direction of the main surface 3a (that is, in a thickness direction of the base 3). The conductive layer 11 is electrically connected to the joining material 7. In the present embodiment, the electrical connection between the conductive layer 11 and the joining material 7 is performed by the conductive vias 13 penetrating the side wall 4A between the conductive layer 11 and the joining material 7. However, an electrical connection method between the conductive layer 11 and the joining material 7 is not limited thereto. One end of the conductive layer 11 in the direction D1 reaches an inner lateral surface 4c of the side wall 4A and is exposed from the inner lateral surface 4c. The other end of the conductive layer 11 in the direction D1 reaches an outer lateral surface 4d of the side wall 4A and is exposed from the outer lateral surface 4d.

A distance h1 between a surface of the side wall 4A joined to the joining material 7 (that is, the bottom surface 4a) and the conductive layer 11 is smaller than a distance h2 between a surface of the side wall 4A on a side opposite to the surface joined to the joining material 7 (that is, the upper surface 4b) and the conductive layer 11. In other words, the conductive layer 11 is disposed closer to the bottom surface 4a in a height direction of the side wall 4A. In one example, a ratio of h1 to h2 (h1/h2) is 1/4. When a thickness of the side wall 4A is 0.5 mm, the distance h1 is 0.1 mm and the distance h2 is 0.4 mm.

As illustrated in FIG. 3, the conductive layer 12 is a layer made of a conductive material embedded in the portion 42 of the side wall 4A, is provided between the bottom surface 4a and the upper surface 4b, and extends along the upper surface 4b of the side wall 4A. The conductive layer 12 of the present embodiment is sandwiched between two dielectric layers constituting the portion 42. The conductive layer 12 is provided at a position overlapping the output lead 6 in the portion 42 when viewed at least in the normal direction of the main surface 3a. The conductive layer 12 is electrically connected to the joining material 10. In the present embodiment, the electrical connection between the conductive layer 12 and the joining material 10 is performed by the conductive vias 14 penetrating the side wall 4A between the conductive layer 12 and the joining material 10. However, an electrical connection method between the conductive layer 12 and the joining material 10 is not limited thereto. One end of the conductive layer 12 in the direction D1 reaches an inner lateral surface 4c of the side wall 4A and is exposed from the inner lateral surface 4c. The other end of the conductive layer 12 in the direction D1 reaches an outer lateral surface 4d of the side wall 4A and is exposed from the outer lateral surface 4d.

A distance h3 between a surface of the side wall 4A joined to the joining material 10 (that is, the upper surface 4b) and the conductive layer 12 is smaller than a distance h4 between a surface of the side wall 4A on a side opposite to the surface joined to the joining material 10 (that is, the bottom surface 4a) and the conductive layer 12. In other words, the conductive layer 12 is disposed closer to the upper surface 4b in a height direction of the side wall 4A. In one example, a ratio of h3 to h4 (h3/h4) is 1/4. When a thickness of the side wall 4A is 0.5 mm, the distance h3 is 0.1 mm and the distance h4 is 0.4 mm.

The conductive layers 11 and 12 are made of a material not containing silver (Ag) and may be made of, for example, a metal material that does not contain Ag. In one example, the conductive layers 11 and 12 have a laminated structure including a tungsten (W) layer and a nickel (Ni) layer. Specifically, tungsten is deposited on an upper layer side of the side wall 4A, and using this as an underlayer, nickel is formed thereon by plating. Similarly, tungsten is deposited also on a lower layer side of the side wall 4A, and using this as an underlayer, nickel is formed thereon by plating. Then, the conductive layers 11 and 12 are formed by thermo-compression bonding the nickel layer on the upper layer side and the nickel layer on the lower layer side to each other. Accordingly, the conductive layers 11 and 12 each have a three-layer structure of tungsten, nickel, and tungsten. End surfaces of the conductive layers 11 and 12 exposed from the inner lateral surface 4c and the outer lateral surface 4d of the side wall 4A are completely covered with Ni plating.

The vias 13 and 14 are formed by depositing tungsten on an inner wall of a through hole formed in the side wall 4A on the lower layer side (or the upper layer side), and using this as an underlayer, nickel is formed by plating to embed the through hole. At that time, the through hole is completely embedded without leaving any vacancies after the above-described thermo-compression bonding. Alternatively, tungsten powder and ceramic powder may be mixed and calcined and then embedded. Diameters of the vias 13 and 14 may be, for example, 0.1 mm.

Figure 4:
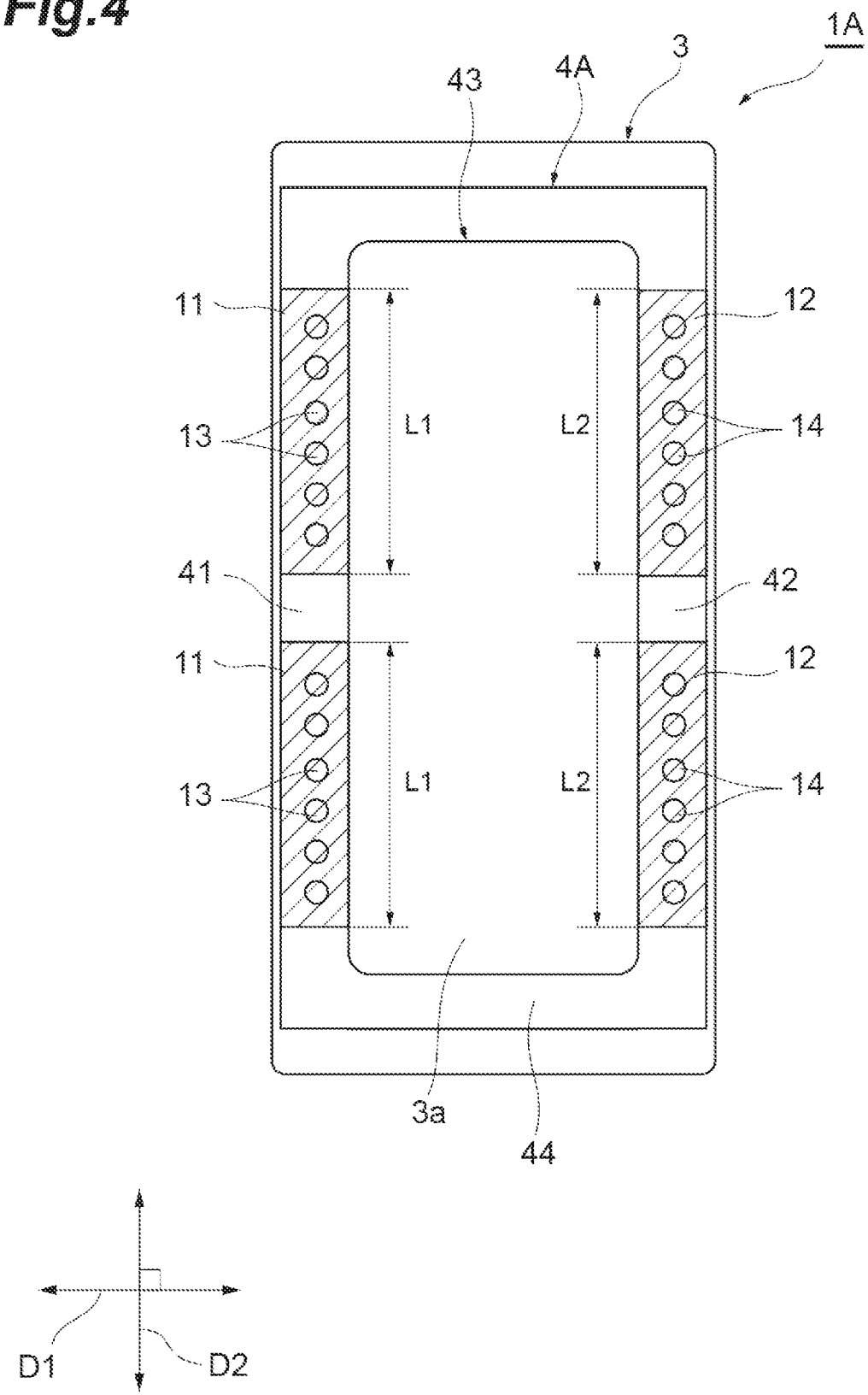
FIG. 4 is a view illustrating a disposition of conductive layers and vias and schematically illustrates a state in which the conductive layers and the vias are viewed from a normal direction of a main surface of a base.

FIG. 4 is a view illustrating a disposition of the conductive layers 11 and 12 and the vias 13 and 14 and schematically illustrates a state in which the conductive layers 11 and 12 and the vias 13 and 14 are viewed from the normal direction of the main surface 3a. For ease of understanding, a range in which the conductive layers 11 and 12 are present is illustrated by hatching. As illustrated in FIG. 4, the conductive layers 11 are separately provided in two places to correspond to the input leads 5, and the conductive layers 12 are separately provided in two places to correspond to the output leads 6. A length L1 of each conductive layer 11 in the direction D2 (that is, a width direction of the input lead 5) is the same as or slightly larger than a width W1 (see FIG. 1) of one end portion of the input lead 5. Therefore, the range in which the conductive layer 11 is present in the direction D2 includes a range in which one end portion of the input lead 5 is present in the direction D2. Similarly, a length L2 of each conductive layer 12 in the direction D2 (that is, a width direction of the output lead 6) is the same as or slightly larger than a width W2 (see FIG. 1) of one end portion of the output lead 6. Therefore, the range in which the conductive layer 12 is present in the direction D2 includes a range in which one end portion of the output lead 6 is present in the direction D2.

In the present embodiment, a plurality of vias 13 are provided to be aligned in a line in the direction D2 for each conductive layer 11. Similarly, a plurality of vias 14 are provided to be aligned in a line in the direction D2 for each conductive layer 12. It is desirable that the vias 13 and 14 be provided as many as possible to reduce an influence on high-frequency signals.

Figure 5:
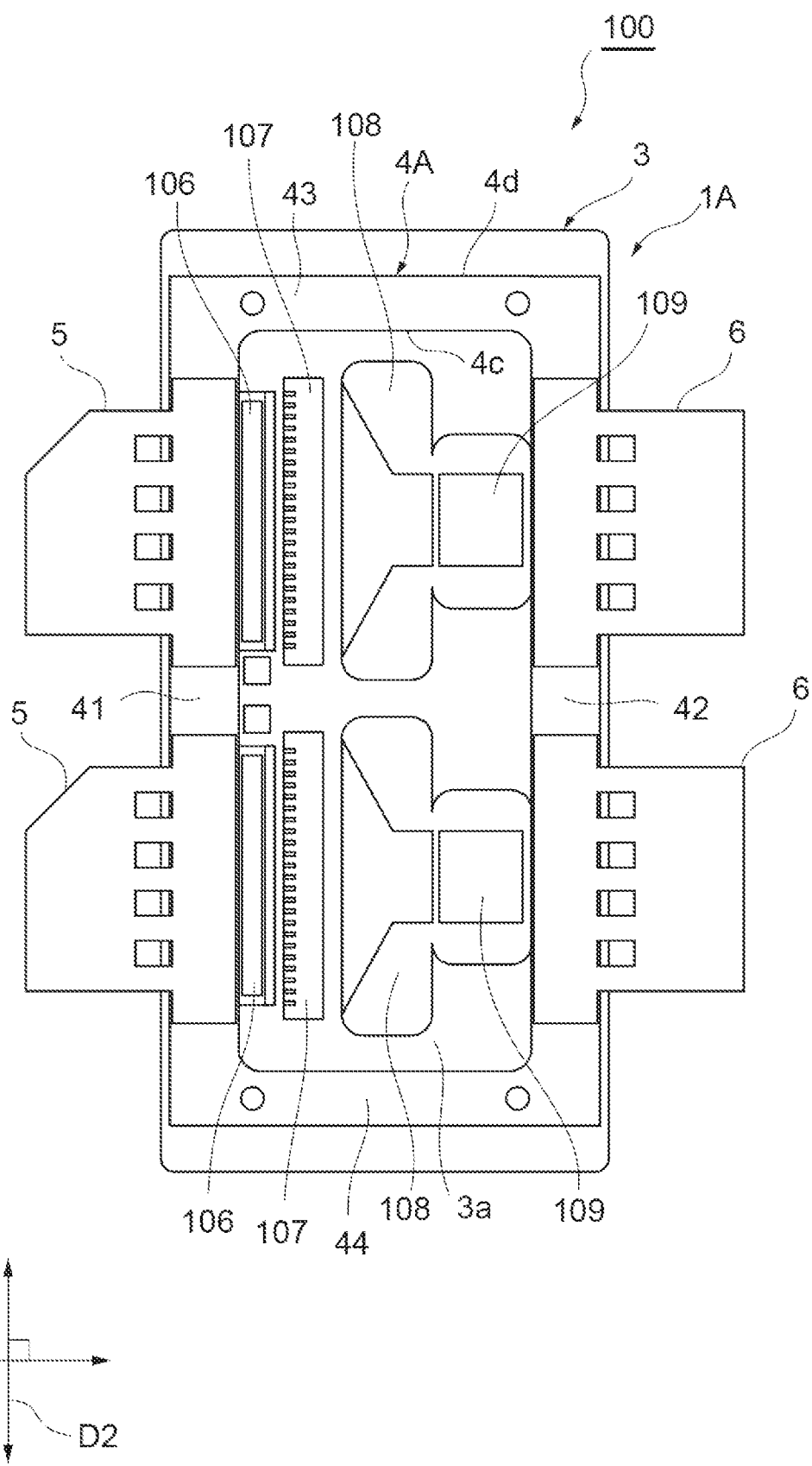
FIG. 5 is a plan view illustrating a configuration of a semiconductor device including the package according to one embodiment.

FIG. 5 is a plan view illustrating a configuration of a semiconductor device 100 including the package 1A of the present embodiment described above. FIG. 5 illustrates a state in which a lid part of the semiconductor device 100 is removed. In addition to the package 1A, the semiconductor device 100 includes an input matching circuit 106, a semiconductor die 107 (semiconductor element), an output matching circuit 108, and an output capacitor 109. The input matching circuit 106, the semiconductor die 107, the output matching circuit 108, and the output capacitor 109 are accommodated in the package 1A and mounted in a region on the main surface 3a of the base 3 surrounded by the side wall 4A. When a hermetic seal is applied by covering the side wall 4A with the lid part in a state in which an internal space of the package 1A is replaced with nitrogen, the semiconductor device 100 can be used.

The input matching circuit 106, the semiconductor die 107, the output matching circuit 108, and the output capacitor 109 are provided in that order from the portion 41 of the side wall 4A. The semiconductor die 107 may be, for example, a transistor including a substrate such as Si, SiC, GaN, GaAs, or diamond, and a back surface of the substrate may be plated with a metal. In one example, the semiconductor die 107 is a GaN-HEMT. The input matching circuit 106 and the output matching circuit 108 may be, for example, parallel plate type capacitors in which electrodes are provided on an upper surface and a lower surface of a ceramic substrate.

The input matching circuit 106, the semiconductor die 107, and the output matching circuit 108 are fixed on the base 3 by a conductive paste. The input matching circuit 106 is mounted on an input side of the semiconductor die 107, and the output matching circuit 108 is mounted on an output side of the semiconductor die 107. The input lead 5 and the input matching circuit 106, the input matching circuit 106 and the semiconductor die 107, the semiconductor die 107 and the output matching circuit 108, the output matching circuit 108 and the output capacitor 109, and the output capacitor 109 and the output lead 6 are electrically connected by a plurality of bonding wires (not illustrated), respectively.

Figure 6:
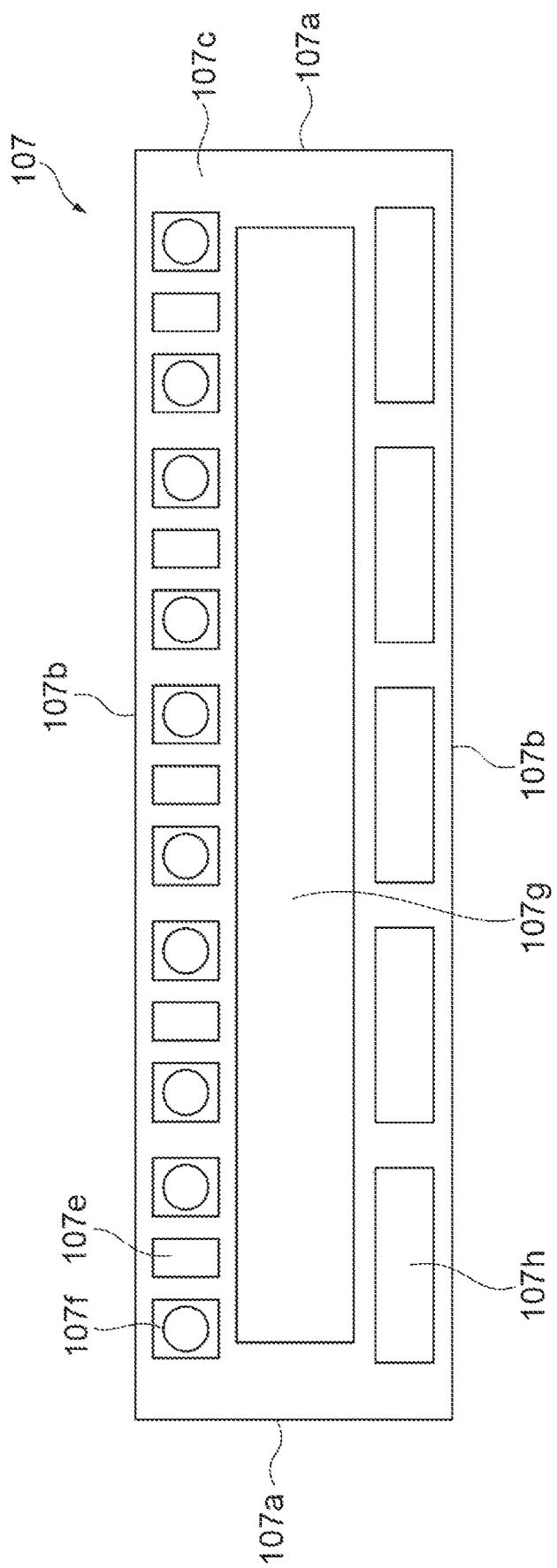
FIG. 6 is a view illustrating a surface of a semiconductor die.
Figure 7:
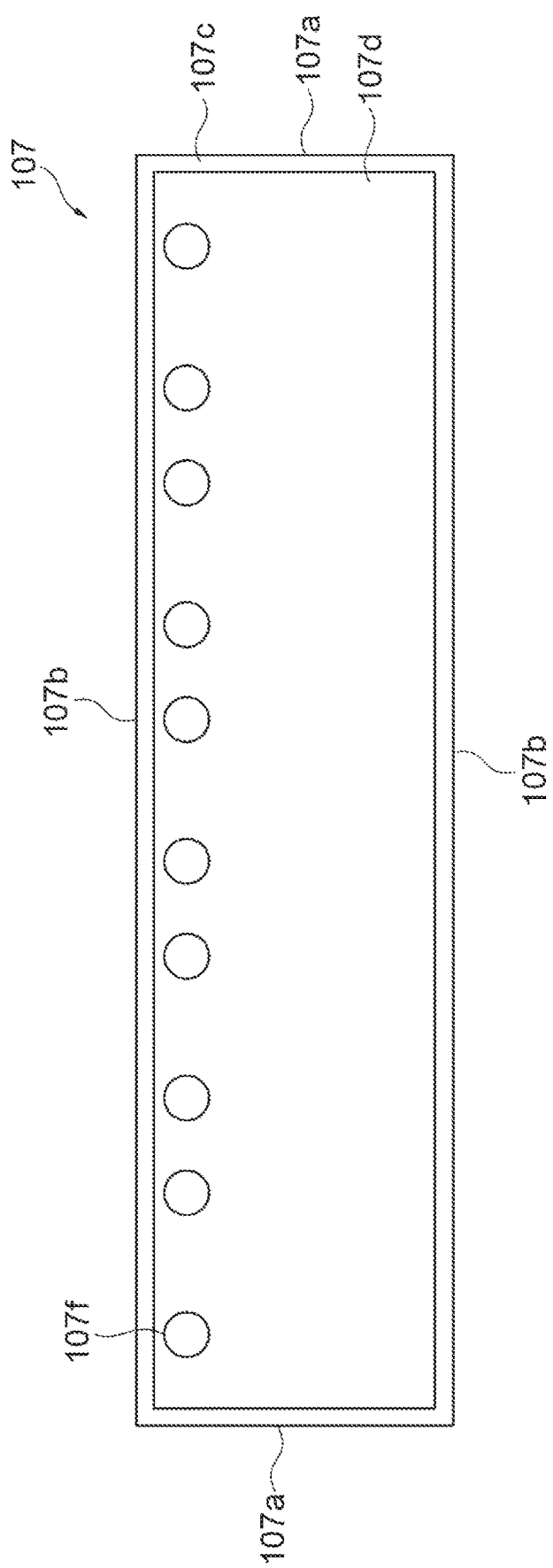
FIG. 7 is a view illustrating a back surface of the semiconductor die.

FIG. 6 is a view illustrating a surface of the semiconductor die 107. FIG. 7 is a view illustrating a back surface of the semiconductor die 107. As illustrated in FIGS. 6 and 7, the semiconductor die 107 has a rectangular shape that extends to be elongated. The semiconductor die 107 has a plan-view shape defined by a pair of short sides 107a and a pair of long sides 107b. The semiconductor die 107 includes a substrate 107c and a source electrode 107d provided on a back surface of the substrate 107c. The semiconductor die 107 includes a plurality of gate electrodes 107e and source vias 107f that are aligned along the long side 107b, an active region 107g, and drain electrodes 107h on the surface of the substrate 107c. The source electrode 107d may be, for example, plated with gold, and a thickness of the source electrode 107d may be 5 μm or more and 20 μm or less.

The gate electrodes 107e are provided on a side opposite to the drain electrodes 107h when viewed from the active region 107g. The active region 107g includes drain fingers and source fingers. The source fingers and the source electrode 107d on the back surface are electrically connected by the source vias 107f penetrating the semiconductor die 107. Since a maximum current value that can be caused to flow from a drain to a source is proportional to a gate width, a large number of drain fingers/source fingers are provided in parallel to increase the gate width in a high output transistor. Thereby, the semiconductor die 107 has a shape that extends to be elongated along the long side 107b.

Here, FIG. 5 is referred to again. The input matching circuit 106 matches impedance between the input lead 5 and the semiconductor die 107. One end of the input matching circuit 106 is electrically connected to the input lead 5 via bonding wires. The other end of the input matching circuit 106 is electrically connected to the gate electrodes 107e (see FIG. 6) of the semiconductor die 107 via bonding wires. In this way, the input lead 5 is electrically connected to the gate electrodes 107e of the semiconductor die 107 via the wiring in the package 1A. Since a negative gate bias lower than a ground potential is applied to the gate electrodes 107e, a potential of the input lead 5 is lower than a potential of the main surface 3a of the base 3.

The output matching circuit 108 adjusts impedance between the semiconductor die 107 and the output lead 6 to impart maximum efficiency to a desired output of high-frequency signals appearing on the output lead 6. One end of the output matching circuit 108 is electrically connected to the drain electrodes 107h (see FIG. 6) of the semiconductor die 107 via bonding wires. The other end of the output matching circuit 108 is electrically connected to the output lead 6 via bonding wires. In this way, the output lead 6 is electrically connected to the drain electrodes 107h of the semiconductor die 107 via the wiring in the package 1A. Since a positive drain bias higher than a ground potential is applied to the drain electrodes 107h, a potential of the output lead 6 is higher than a potential of the main surface 3a of the base 3.

Figure 8:
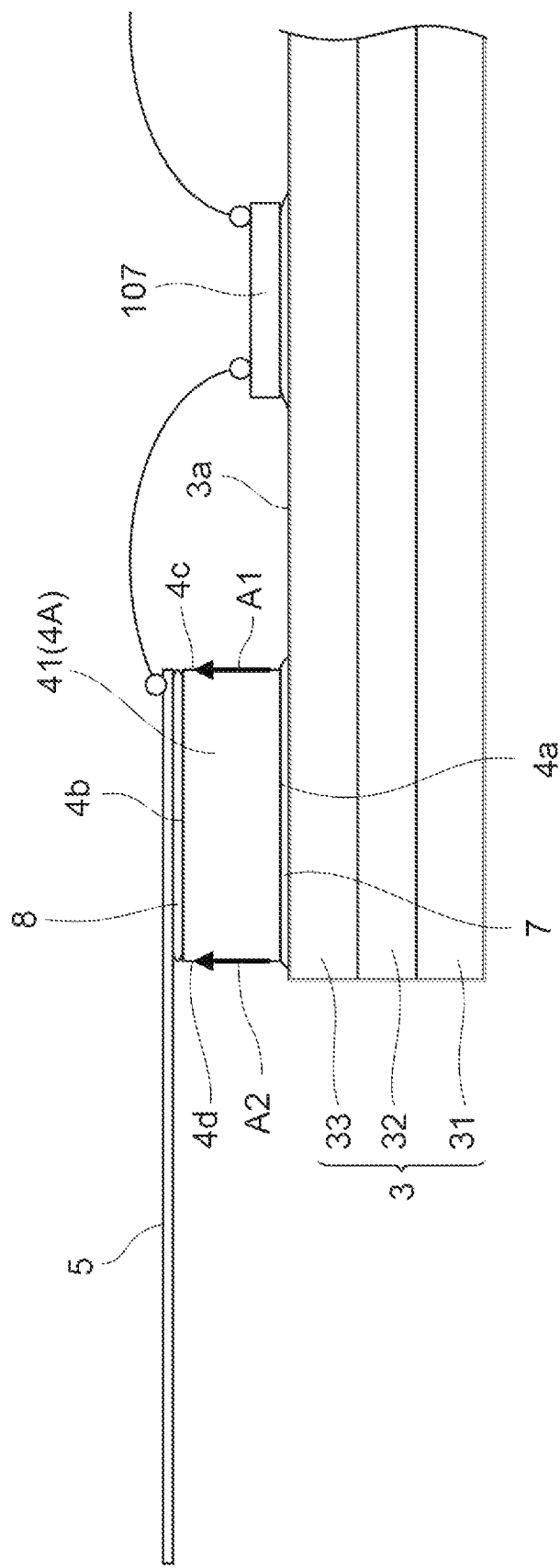
FIG. 8 is a schematic view illustrating a state in which dendrites of Ag grow from a joining material toward an input lead.

Effects obtained by the package 1A and the semiconductor device 100 of the present embodiment having the above-described configurations will be described. As illustrated in FIG. 2, the package 1A includes the base 3 having the main surface 3a made of a metal, the dielectric side wall 4A having the bottom surface 4a joined to the main surface 3a via the joining material 7, and the input lead 5 made of a metal joined to the upper surface 4b of the side wall 4A. The joining material 7 contains silver (Ag), and a potential of the input lead 5 is lower than a potential of the main surface 3a of the base 3. In a case without any devising, as illustrated in the schematic view illustrated in FIG. 8, ion migration occurs due to an electric field generated between the input lead 5 and the main surface 3a, and dendrites of Ag grow from the joining material 7 toward the input lead 5 on the inner lateral surface 4c and the outer lateral surface 4d of the side wall 4A (arrows A1 and A2 in FIG. 8). If the input lead 5 and the main surface 3a are short-circuited by the dendrites, this leads to a failure of the semiconductor device 100.

In recent years, wide-gap semiconductors using GaN, SiC, $Ga_2O_3$, or the like as a main semiconductor material have been actively developed and put to practical use. Since wide-gap semiconductors have a high withstand voltage, mobility is increased by increasing power supply voltage or parasitic capacitance between electrodes is reduced, and thereby performance of the semiconductors is improved.

Therefore, the above-described electric field becomes strong and ion migration occurs easily in the wide-gap semiconductors.

In order to solve the above-described problem, the package 1A of the present embodiment includes the conductive layer 11 illustrated in FIG. 2. As described above, the conductive layer 11 is provided between the bottom surface 4a and the upper surface 4b of the side wall 4A at a position overlapping the input lead 5 when viewed from the normal direction of the main surface 3a, is electrically connected to the joining material 7, extends along the bottom surface 4a, and is exposed from the inner lateral surface 4c and the outer lateral surface 4d of the side wall 4A. The conductive layer 11 does not contain Ag. When such a conductive layer 11 is exposed from the side wall 4A on the inner lateral surface 4c and the outer lateral surface 4d, an electric field is mainly generated between the conductive layer 11 and the input lead 5, and an electric field generated between the conductive layer 11 and the main surface 3a is little. Since a force for moving Ag ions between the conductive layer 11 and the main surface 3a is extremely weak, growth of dendrites of Ag on the inner lateral surface 4c and the outer lateral surface 4d can be suppressed, and short-circuiting between the main surface 3a of the base 3 and the input lead 5 can be reduced.

As illustrated in FIG. 3, the output lead 6 is joined to the upper surface 4b of the side wall 4A via the joining material 10. The joining material 10 contains Ag, and a potential of the output lead 6 is higher than a potential of the main surface 3a of the base 3. In a case without any devising, ion migration occurs due to an electric field generated between the output lead 6 and the main surface 3a, and dendrites of Ag grow from the joining material 10 toward the main surface 3a on the inner lateral surface 4c and the outer lateral surface 4d of the side wall 4A. If the output lead 6 and the main surface 3a are short-circuited by the dendrites, this leads to a failure of the semiconductor device 100.

In order to solve this problem, the package 1A of the present embodiment includes the conductive layer 12 illustrated in FIG. 3. As described above, the conductive layer 12 is provided between the bottom surface 4a and the upper surface 4b of the side wall 4A at a position overlapping the output lead 6 when viewed from the normal direction of the main surface 3a, is electrically connected to the joining material 10, extends along the upper surface 4b, and is exposed from the inner lateral surface 4c and the outer lateral surface 4d of the side wall 4A. The conductive layer 12 does not contain Ag. When such a conductive layer 12 is exposed from the side wall 4A on the inner lateral surface 4c and the outer lateral surface 4d, an electric field is mainly generated between the conductive layer 12 and the main surface 3a, and an electric field generated between the conductive layer 12 and the output lead 6 is little. Since a force for moving Ag ions between the conductive layer 12 and the output lead 6 is extremely weak, growth of dendrites of Ag on the inner lateral surface 4c and the outer lateral surface 4d can be suppressed, and short-circuiting between the main surface 3a of the base 3 and the output lead 6 can be reduced.

As in the present embodiment, on the input side, electrical connection between the conductive layer 11 and the joining material 7 may be performed by the conductive vias 13 each penetrating the side wall 4A between the conductive layer 11 and the joining material 7. On the output side, electrical connection between the conductive layer 12 and the joining material 10 may be performed by the conductive vias 14 each penetrating the side wall 4A between the conductive layer 12 and the joining material 10. In either case, the conductive layer 11 and the joining material 7, and the conductive layer 12 and the joining material 10 can be electrically connected with a simple structure.

As in the present embodiment, the distance h1 between the bottom surface 4a of the side wall 4A joined to the joining material 7 and the conductive layer 11 may be smaller than the distance h2 between the upper surface 4b of the side wall 4A on a side opposite to the bottom surface 4a joined to the joining material 7 and the conductive layer 11. The distance h3 between the upper surface 4b of the side wall 4A joined to the joining material 10 and the conductive layer 12 may be smaller than the distance h4 between the bottom surface 4a of the side wall 4A on a side opposite to the upper surface 4b joined to the joining material 10 and the conductive layer 12.

As in the present embodiment, the side wall 4A may be formed of a ceramic, and the conductive layers 11 and 12 may have a laminated structure including a tungsten (W) layer and a nickel (Ni) layer. In this case, the conductive layers 11 and 12 can each be easily formed between the ceramic layers constituting the side wall 4A, and a strength of the side wall 4A can also be maintained.

First Modified Example

Figure 9:
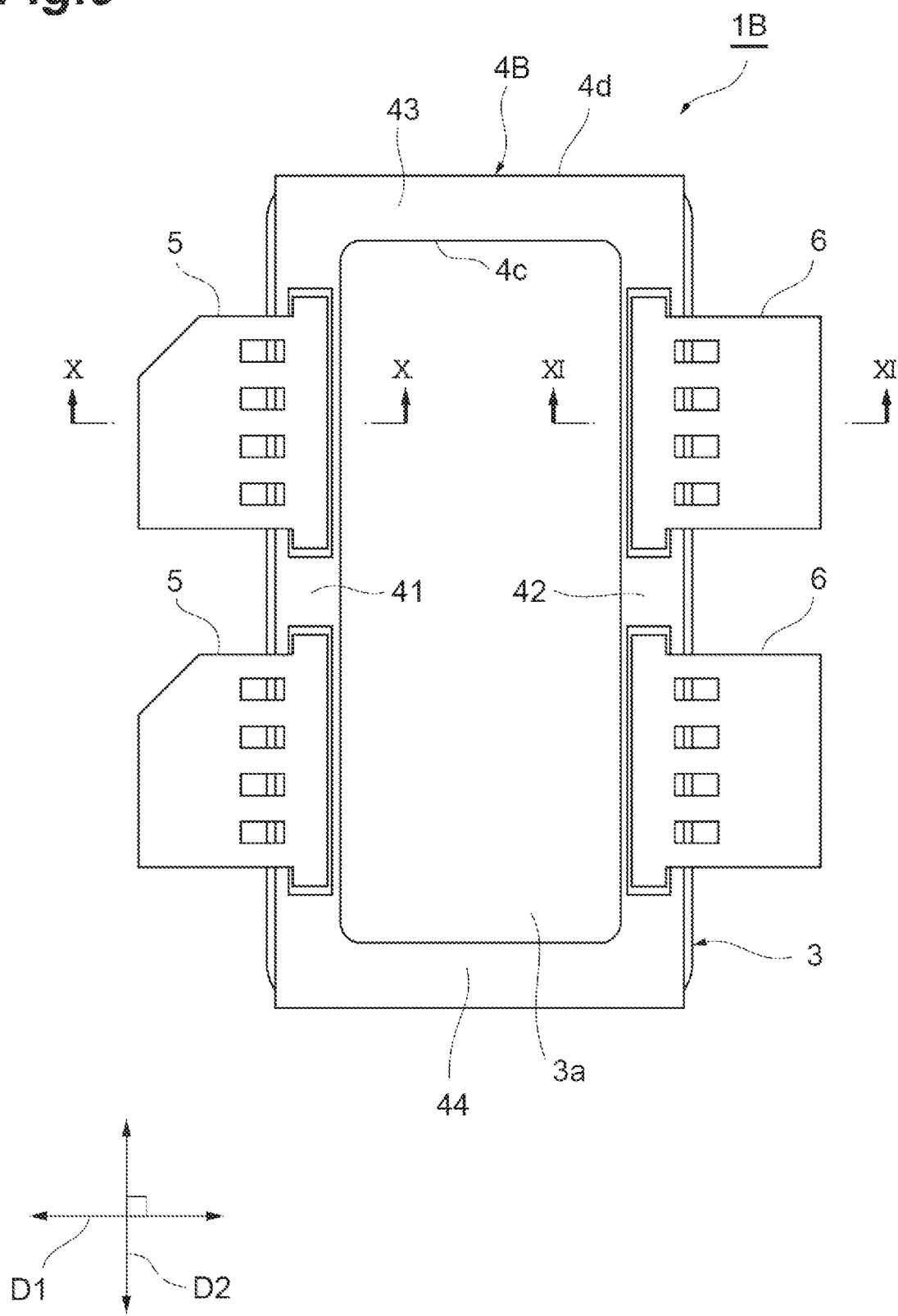
FIG. 9 is a plan view illustrating a semiconductor device package according to a first modified example.
Figure 10:
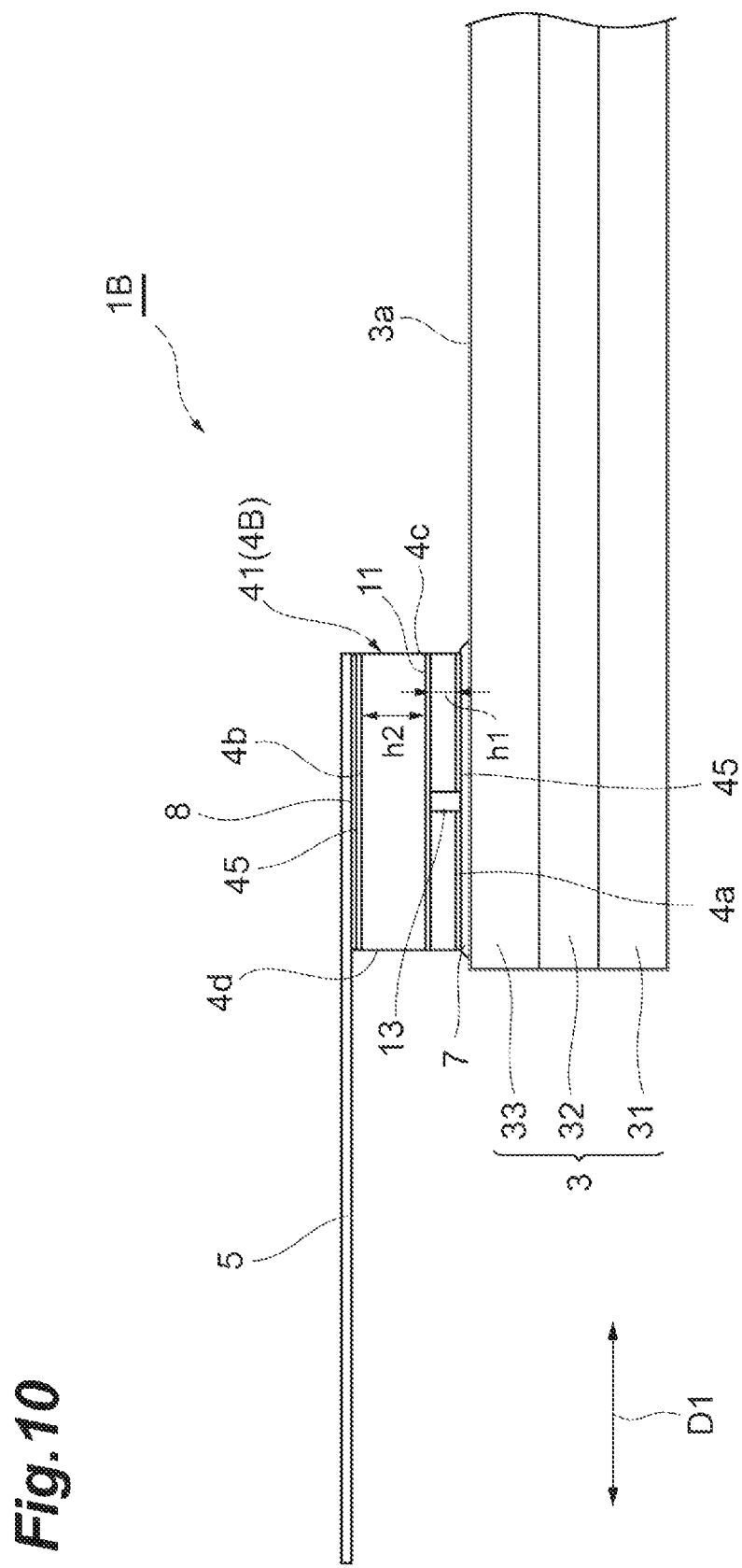
FIG. 10 is a view schematically illustrating a cross section of a part of the semiconductor device package according to the first modified example, taken along line X-X of FIG. 9.
Figure 11:
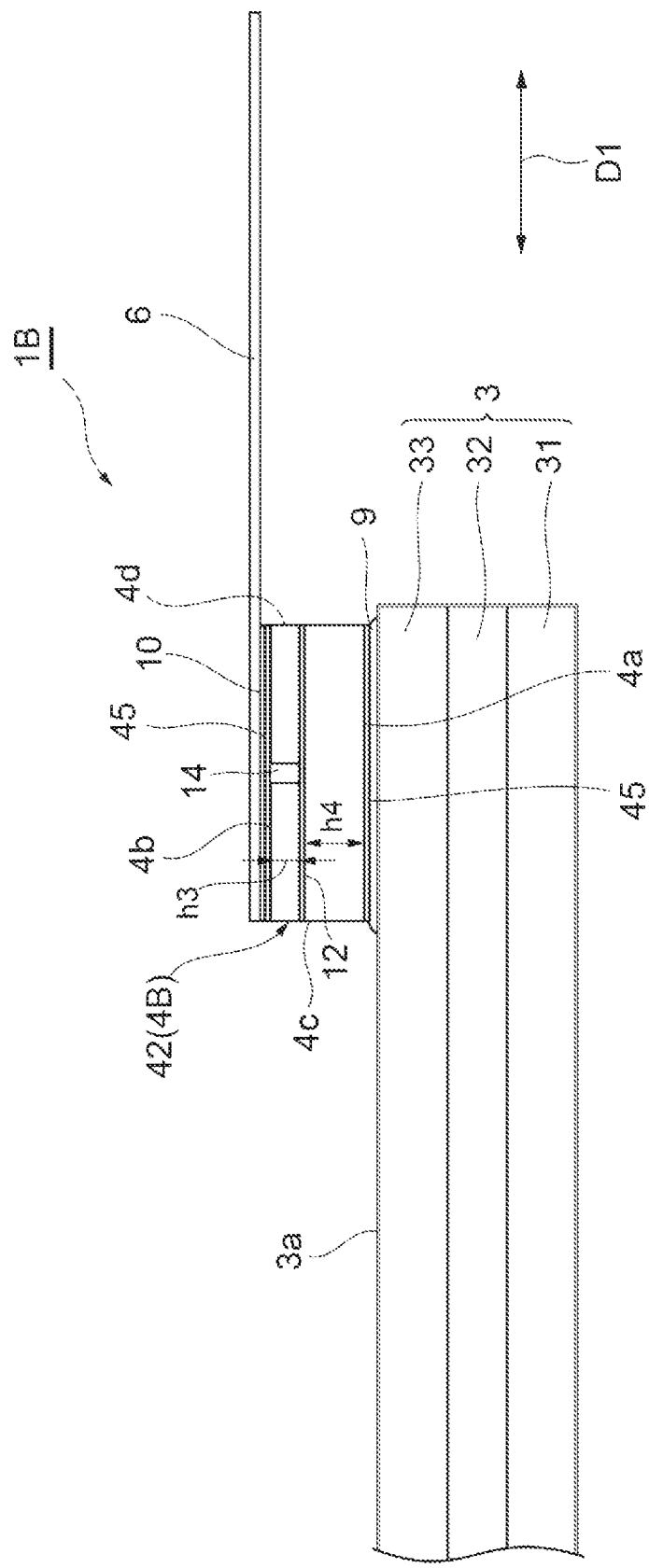
FIG. 11 is a view schematically illustrating a cross section of a part of the semiconductor device package according to the first modified example, taken along line XI-XI of FIG. 9.

FIG. 9 is a plan view illustrating a package 1B according to a first modified example of the above-described embodiment. FIG. 10 is a view schematically illustrating a cross section of the package 1B along line X-X of FIG. 9. FIG. 11 is a view schematically illustrating a cross section of the package 1B along line XI-XI of FIG. 9. As illustrated in FIGS. 9 to 11, the package 1B of the present modified example includes a base 3, a side wall 4B, two input leads 5, two output leads 6, joining materials 7 to 10, conductive layers 11 and 12, a plurality of vias 13, and a plurality of vias 14. Of these, details of the other configurations except for the side wall 4B and the conductive layers 11 and 12 are the same as those in the above-described embodiment.

The side wall 4B is a substantially rectangular frame-shaped member made of a resin (for example, paper epoxy, glass epoxy, or the like normally used for a printed circuit board (PCB)). As in the side wall 4A described above, the side wall 4B includes a pair of portions 41 and 42 facing each other in a direction D1 along a main surface 3a of the base 3, and a pair of portions 43 and 44 facing each other in a direction D2 intersecting (for example, perpendicular to) the direction D1. The portions 41 and 42 extend along the direction D2 in parallel to each other, and the portions 43 and 44 extend in the direction D1 in parallel to each other. A cross section of each of the portions 41 to 44 perpendicular to its extending direction has a rectangular shape or a square shape. A height of the side wall 4B in a normal direction of the main surface 3a may be, for example, 0.1 mm or more and 1.0 mm or less.

As illustrated in FIGS. 10 and 11, the side wall 4B includes a flat bottom surface 4a facing the main surface 3a of the base 3, and an upper surface 4b on a side opposite to the bottom surface 4a. Printed wiring patterns 45 are formed on the entire surfaces of the bottom surface 4a and the upper surface 4b. Each printed wiring pattern 45 is a metal film (specifically, a Cu film plated with Au or Ni) fixed to the side wall 4B. As illustrated in FIG. 10, the bottom surface 4a of the portion 41 is joined to the main surface 3a of the base 3 via the printed wiring pattern 45 and the joining material 7. In other words, the joining material 7 joins the bottom surface 4a of the portion 41 and the main surface 3a of the base 3 to each other. Further, as illustrated in FIG. 11, the bottom surface 4a of the portion 42 is joined to the main surface 3a of the base 3 via the printed wiring pattern 45 and the joining material 9. In other words, the joining material 9 joins the bottom surface 4a of the portion 42 and the main surface 3a of the base 3 to each other. These joining materials 7 and 9 contain silver (Ag) as in the above-described embodiment. As a joining material containing Ag, silver brazing material or other silver-based joining materials can be exemplified. As the other silver-based joining materials, an epoxy adhesive containing a silver filler having a particle size of 10 nm or more and 10 μm or less, a sintered nano-silver paste formed of a silver filler and a solvent, and the like can be exemplified. All of them have a phenomenon that a fine silver filler is activated and melted at a low temperature to cause metallic bonding between gold (Au) and silver (Ag), and thus are excellent in strength and long-term reliability. In one embodiment, the joining materials 7 and 9 are sintered nano-silver pastes.

One end portion of the input lead 5 in the direction D1 faces the upper surface 4b of the portion 41 of the side wall 4B. The input lead 5 is insulated from the main surface 3a of the base 3 by the portion 41 of the side wall 4B. As illustrated in FIG. 10, one end portion of the input lead 5 is joined to the upper surface 4b of the portion 41 via the joining material 8 and the printed wiring pattern 45. In other words, the joining material 8 joins the upper surface 4b of the portion 41 and one end portion of the input lead 5 to each other. One end portion of the output lead 6 in the direction D1 faces the upper surface 4b of the portion 42 of the side wall 4B. The output lead 6 is insulated from the main surface 3a of the base 3 by the portion 42 of the side wall 4B. As illustrated in FIG. 11, one end portion of the output lead 6 is joined to the upper surface 4b of the portion 42 via the joining material 10 and the printed wiring pattern 45. In other words, the joining material 10 joins the upper surface 4b of the portion 42 and one end portion of the output lead 6 to each other. These joining materials 8 and 10 contain silver (Ag). In one embodiment, the joining materials 8 and 10 are sintered nano-silver pastes.

The conductive layers 11 and 12 have the same configurations as those in the above-described embodiment except for the following points. That is, the conductive layers 11 and 12 of the present modified example have a laminated structure including a Cu layer and an Au layer or a nickel Ni layer. Specifically, a Cu film is formed on an upper layer side of the side wall 4B by, for example, electroless plating, and then Au or Ni is formed on a surface thereof by electroplating. Similarly, a Cu film is formed on a lower layer side of the side wall 4B, and then Au or Ni is formed on a surface thereof by electroplating. Then, the conductive layers 11 and 12 are formed by thermo-compression bonding the Au layers or the Ni layers on the upper layer side and the lower layer side. Thus, the conductive layers 11 and 12 of the present modified example have a three-layer structure of Cu, Au (or Ni), and Cu. End surfaces of the conductive layers 11 and 12 exposed from an inner lateral surface 4c and an outer lateral surface 4d of the side wall 4B are completely covered with Au plating or Ni plating.

The vias 13 and 14 are formed by electroless copper plating in through holes formed on the lower layer side (or the upper layer side) of the side wall 4B. At that time, the through holes are completely embedded without leaving any vacancies in the through holes after thermo-compression bonding.

Figure 12:
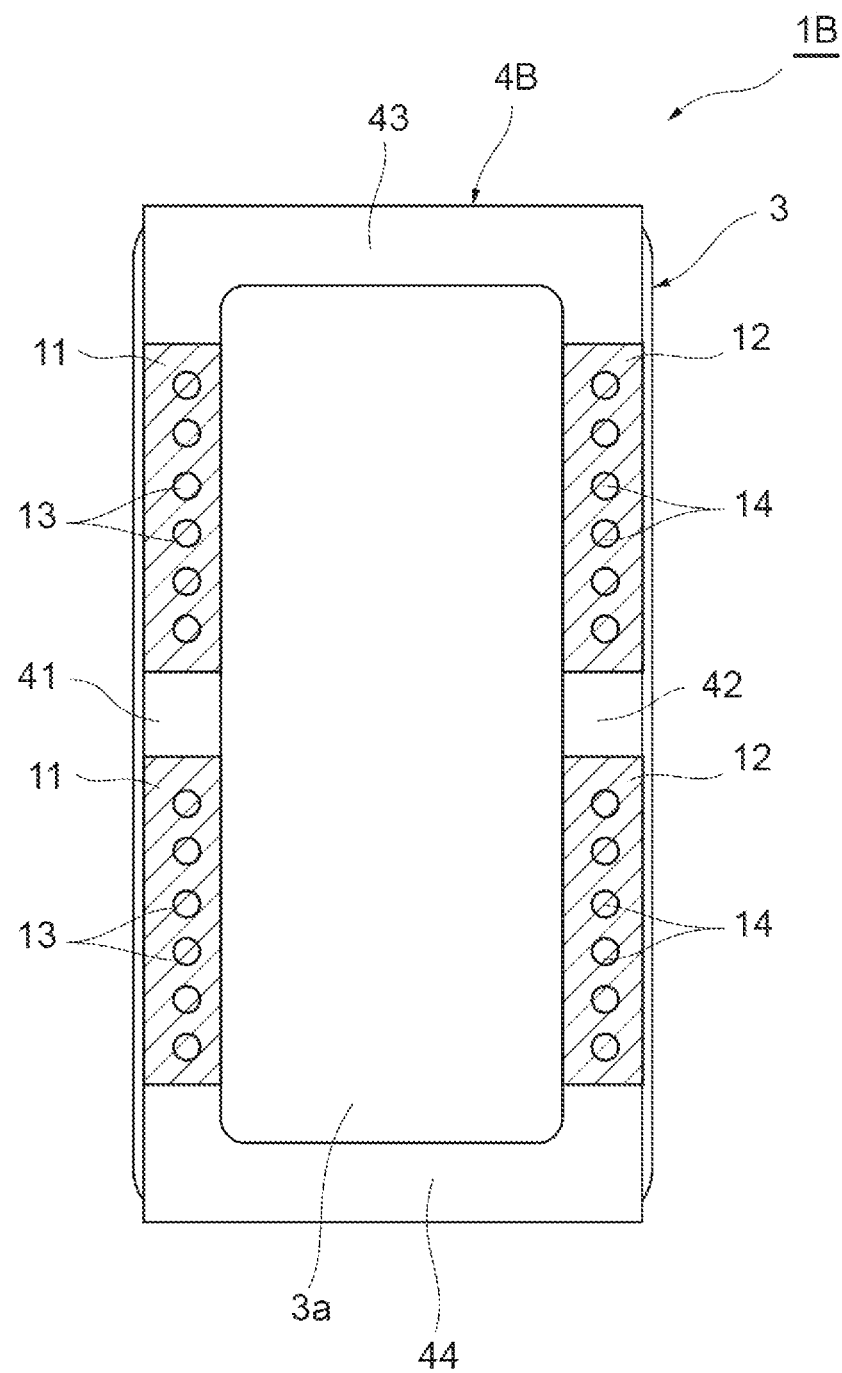
FIG. 12 is a view illustrating a disposition of conductive layers and vias in the first modified example and schematically illustrates a state in which the conductive layers and the vias are viewed from a normal direction of a main surface of a base.

FIG. 12 is a view illustrating a disposition of the conductive layers 11 and 12 and the vias 13 and 14 in the present modified example and schematically illustrates a state in which the conductive layers 11 and 12 and the vias 13 and 14 are viewed from a normal direction of the main surface 3a. For ease of understanding, a range in which the conductive layers 11 and 12 are present is illustrated by hatching. As illustrated in FIG. 12, a disposition of the conductive layers 11 and 12 and the vias 13 and 14 in the present modified example is the same as that of the above-described embodiment.

In the present modified example, the conductive layer 11 illustrated in FIG. 10 is provided in the side wall 4B. As in the above-described embodiment, the conductive layer 11 is provided between the bottom surface 4a and the upper surface 4b of the side wall 4B at a position overlapping the input lead 5 when viewed from the normal direction of the main surface 3a, is electrically connected to the joining material 7, extends along the bottom surface 4a, and is exposed from the inner lateral surface 4c and the outer lateral surface 4d of the side wall 4B. The conductive layer 11 does not contain Ag. Thus, growth of dendrites of Ag on the inner lateral surface 4c and the outer lateral surface 4d can be suppressed, and short-circuiting between the main surface 3a of the base 3 and the input lead 5 can be reduced.

In the present modified example, the conductive layer 12 illustrated in FIG. 11 is provided. As in the above-described embodiment, the conductive layer 12 is provided between the bottom surface 4a and the upper surface 4b of the side wall 4B at a position overlapping the output lead 6 when viewed from the normal direction of the main surface 3a, is electrically connected to the joining material 10, extends along the upper surface 4b, and is exposed from the inner lateral surface 4c and the outer lateral surface 4d of the side wall 4B. The conductive layer 12 does not contain Ag. Thus, growth of dendrites of Ag on the inner lateral surface 4c and the outer lateral surface 4d can be suppressed, and short-circuiting between the main surface 3a of the base 3 and the output lead 6 can be reduced.

Second Modified Example

Figure 13:
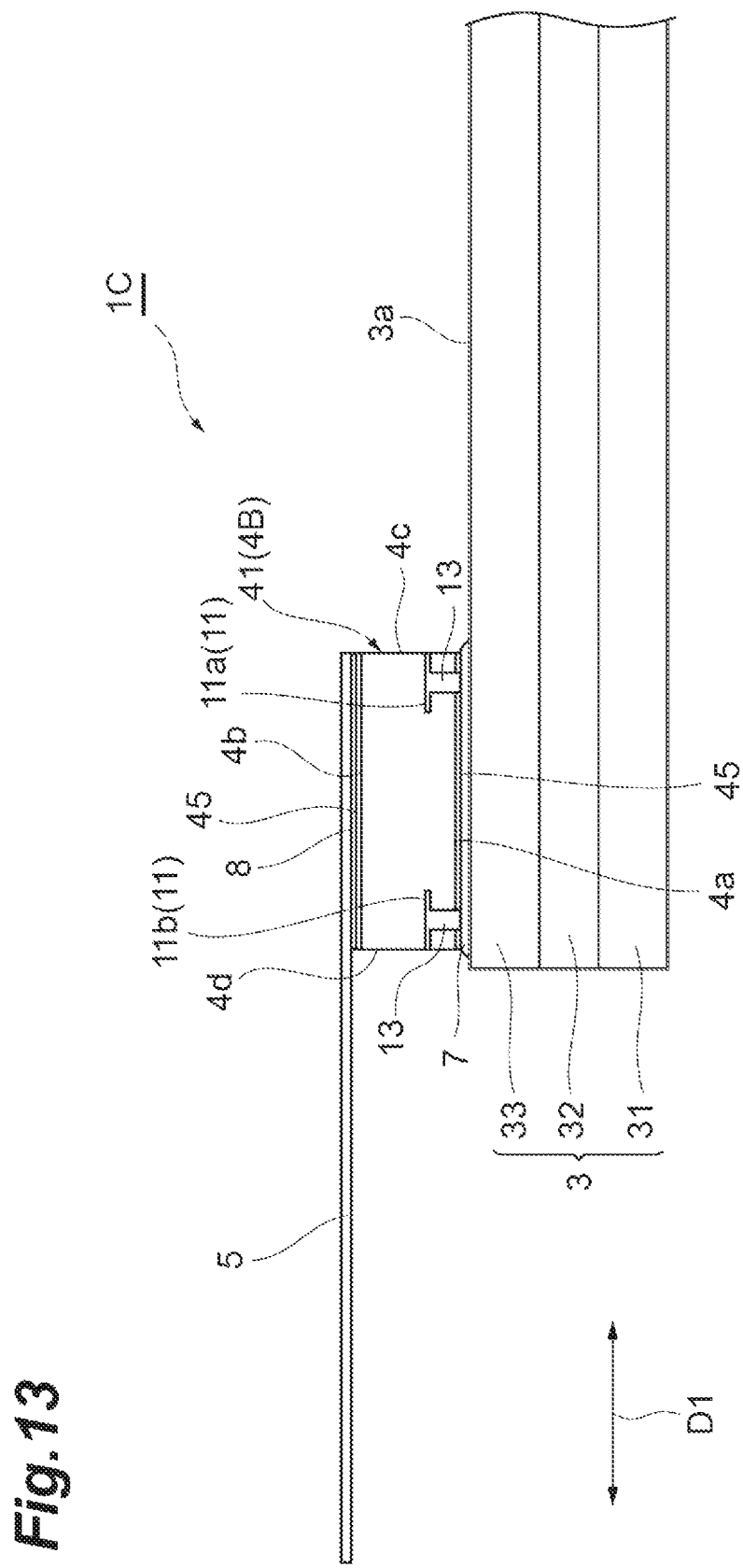
FIG. 13 is a view schematically illustrating a cross section including an input lead of a semiconductor device package according to a second modified example.
Figure 14:
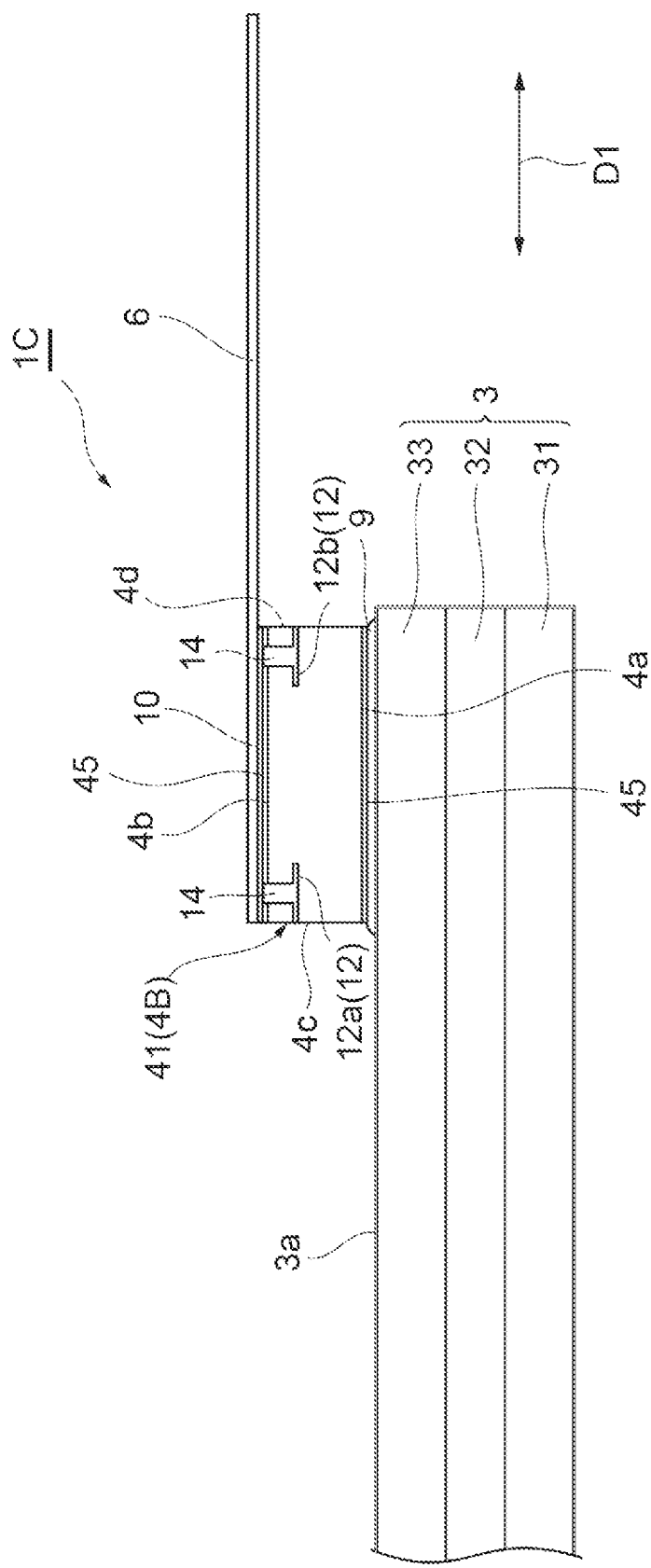
FIG. 14 is a view schematically illustrating a cross section including an output lead of the semiconductor device package according to the second modified example.
Figure 15:
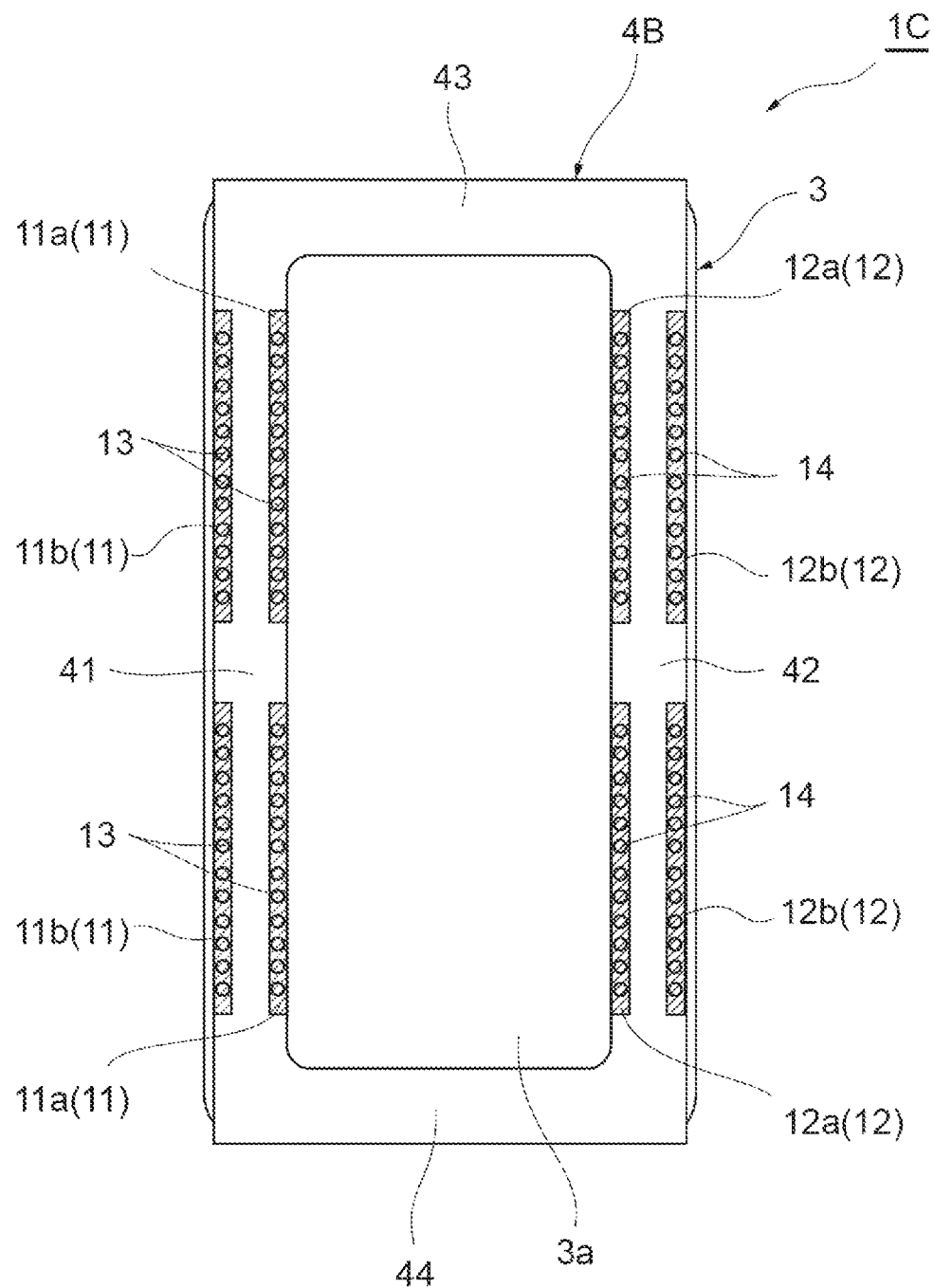
FIG. 15 is a view illustrating a disposition of conductive layers and vias in the second modified example and schematically illustrates a state in which the conductive layers and the vias are viewed from a normal direction of a main surface of a base.

FIG. 13 is a view schematically illustrating a cross section including an input lead 5 of a package 1C according to a second modified example of the above-described embodiment. FIG. 14 is a view schematically illustrating a cross section including an output lead 6 of the package 1C. FIG. 15 is a view illustrating a disposition of conductive layers 11 and 12 and vias 13 and 14 in the present modified example and schematically illustrates a state in which the conductive layers 11 and 12 and the vias 13 and 14 are viewed from a normal direction of a main surface 3a. For ease of understanding, a range in which the conductive layers 11 and 12 are present is illustrated by hatching.

As illustrated in FIGS. 13 to 15, the package 1C of the present modified example includes a base 3, a side wall 4B, the input leads 5, the output leads 6, joining materials 7 to 10, the conductive layers 11 and 12, a plurality of vias 13, and a plurality of vias 14. Of these, details of the other configurations except for the conductive layers 11 and 12, the plurality of vias 13, and the plurality of vias 14 are the same as those in the above-described first modified example.

As illustrated in FIGS. 13 and 15, the conductive layer 11 of the present modified example is configured to include a first portion 11a that is provided to be biased toward an inner lateral surface 4c of the side wall 4B and is exposed from the inner lateral surface 4c, and a second portion 11b that is provided to be biased toward an outer lateral surface 4d of the side wall 4B and is exposed from the outer lateral surface 4d. The first portion 11a and the second portion 11b are provided at an equal distance from a bottom surface 4a and are disposed to be aligned in a direction intersecting a direction in which a portion 41 of the side wall 4B extends with a space therebetween. The first portion 11a and the second portion 11b are electrically connected to the joining material 7 via the plurality of vias 13 aligned in the direction in which the portion 41 extends.

As illustrated in FIG. 14, the conductive layer 12 of the present modified example is configured to include a first portion 12a that is provided to be biased toward an inner lateral surface 4c of the side wall 4B and is exposed from the inner lateral surface 4c, and a second portion 12b that is provided to be biased toward an outer lateral surface 4d of the side wall 4B and is exposed from the outer lateral surface 4d. The first portion 12a and the second portion 12b are provided at an equal distance from the bottom surface 4a and are disposed to be aligned in a direction intersecting a direction in which a portion 42 of the side wall 4B extends with a space therebetween. The first portion 12a and the second portion 12b are electrically connected to the joining material 10 via the plurality of vias 14 aligned in the direction in which the portion 42 extends.

In the above-described embodiment, since the conductive layers 11 and 12 having a ground potential are disposed at positions facing the input lead 5 and the output lead 6, a capacitance between electrodes becomes large, and this may cause a trouble in high-frequency impedance matching. In such a case, as in the present modified example, portions of the conductive layers 11 and 12 positioned inside the side wall 4B may be removed. In this case, decrease in impedance can be suppressed while suppressing growth of dendrites of Ag, and thereby matching of high-frequency signals can be facilitated.

Third Modified Example

Figure 16:
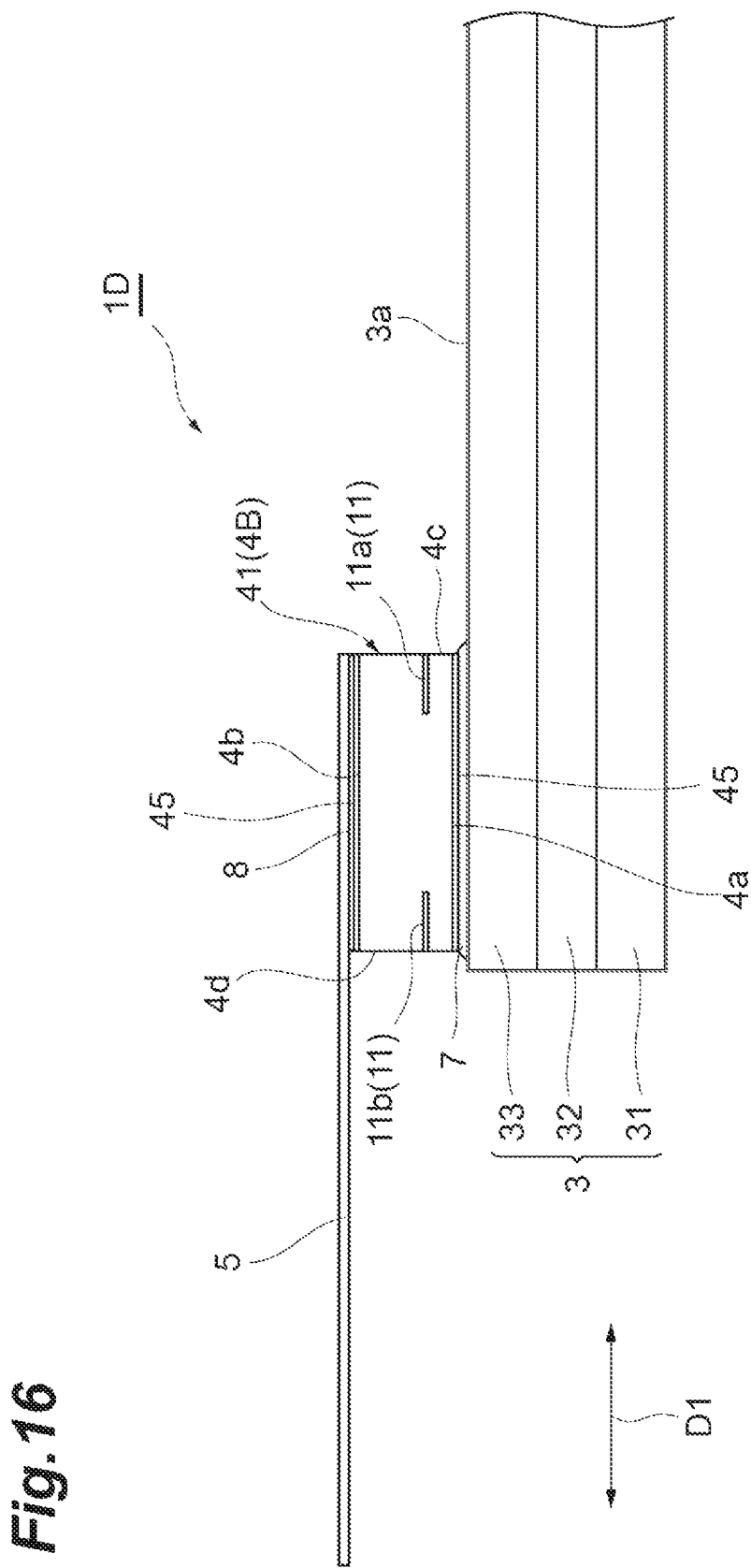
FIG. 16 is a view schematically illustrating a cross section including an input lead of a semiconductor device package according to a third modified example.

FIG. 16 is a view schematically illustrating a cross section including an input lead 5 of a package 1D according to a third modified example of the above-described embodiment. FIG. 17 is a view schematically illustrating a cross section including an output lead 6 of the package 1D. FIGS. 18A and 18B are views illustrating dispositions of conductive layers 11 and 12 and vias 13 and 14 in the present modified example and schematically illustrates a state in which the conductive layers 11 and 12 and the vias 13 and 14 are viewed from a normal direction of a main surface 3a. For ease of understanding, a range in which the conductive layers 11 and 12 are present is illustrated by hatching.

As illustrated in FIGS. 16, 17, 18A, and 18B, the package 1D of the present modified example includes a base 3, a side wall 4B, the input leads 5, the output leads 6, joining materials 7 to 10, the conductive layers 11 and 12, a single (or two) via 13, and a single (or two) via 14. Of these, details of the other configurations except for the conductive layers 11 and 12, and the vias 13 and 14 are the same as those in the above-described second modified example.

The via 13 of the present modified example is not provided just below the input lead 5 as illustrated in FIG. 16, but is provided at a position of the side wall 4B other than just below the input lead 5 as illustrated in FIGS. 18A and 18B. Specifically, the via 13 is provided at a region between two input leads 5 in a portion 41 in the example illustrated in FIG. 18A, and the vias 13 are provided in portions 43 and 44 in the example illustrated in FIG. 18B. Similarly, the via 14 of the present modified example is not provided just below the output lead 6 as illustrated in FIG. 17, but is provided at a position of the side wall 4B other than just below the output lead 6 as illustrated in FIGS. 18A and 18B. Specifically, the via 14 is provided at a region between two output leads 6 in a portion 42 in the example illustrated in FIG. 18A, and the vias 14 are provided in the portions 43 and 44 in the example illustrated in FIG. 18B.

Potentials of the conductive layers 11 and 12 of the above-described embodiment may have some variation from potentials of the joining materials 7 and 10, and are not required to be exactly the same potential as each other. Thus, the vias 13 and 14 may each be single (or two) via as in the present modified example and may each be disposed away from the input lead 5 and the output lead 6. Even in such a form, effects of the above-described embodiment can be sufficiently achieved.

Fourth Modified Example

Figure 20:
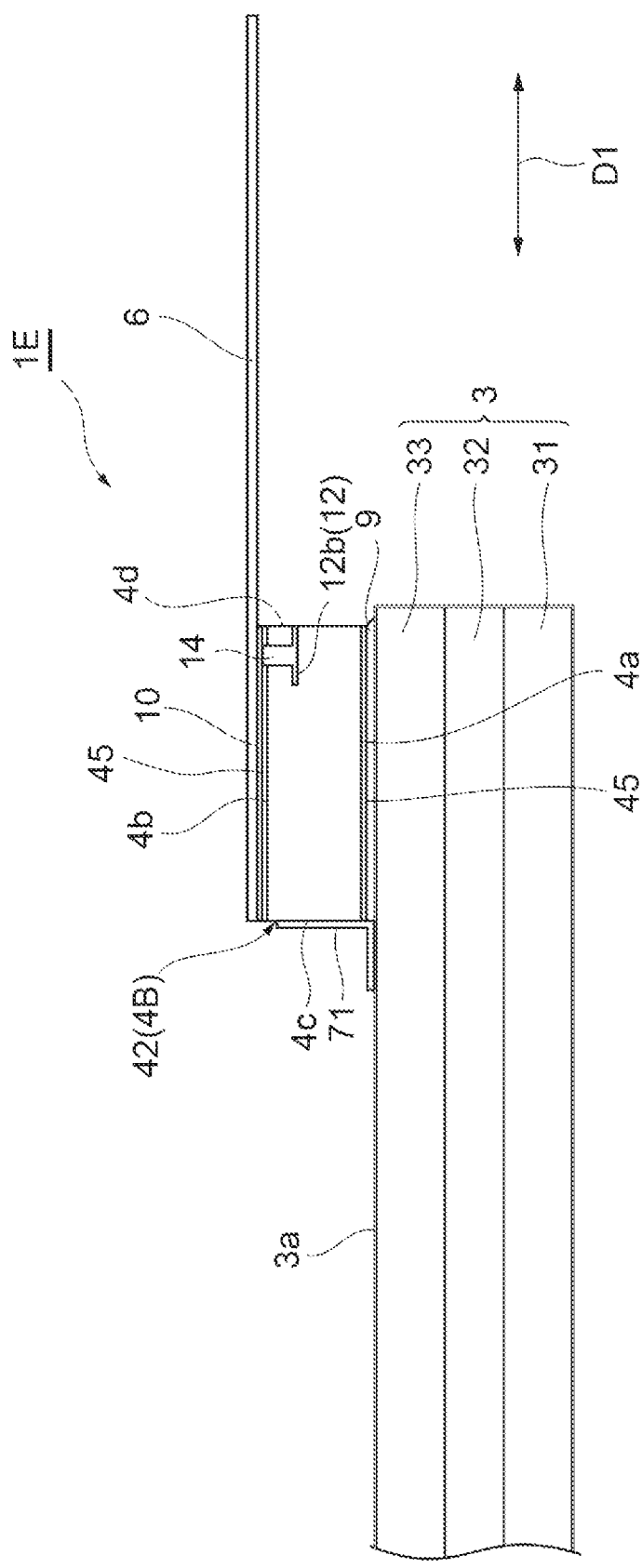
FIG. 20 is a view schematically illustrating a cross section including an output lead of the semiconductor device package according to the fourth modified example.

FIG. 19 is a view schematically illustrating a cross section including an input lead 5 of a package 1E according to a fourth modified example of the above-described embodiment. FIG. 20 is a view schematically illustrating a cross section including an output lead 6 of the package 1E. As illustrated in FIGS. 19 and 20, in the present modified example, a resin film 71 is provided on a surface from a main surface 3a of a base 3 to an inner lateral surface 4c of a side wall 4B. The resin film 71 is a film for covering an entire conductive silver paste exposed inside the package 1E to prevent dendrites of Ag caused by the conductive silver paste used for mounting a semiconductor die 107 (see FIG. 5). The resin film 71 may be a film that is provided for improving humidity resistance of the inner lateral surface 4c.

In this case, as illustrated in FIG. 19, since an end surface of the joining material 7 exposed from the inner lateral surface 4c is covered by the resin film 71, migration of Ag does not easily occur. Thus, the first portion 11a (see FIG. 13) illustrated in the second modified example can be omitted, and only the second portion 11b can be used. As illustrated in FIG. 20, since the joining material 10 and an exposed surface of the main surface 3a becomes farther in distance, it can be made difficult for the output lead 6 and the main surface 3a to be short-circuited due to the dendrites of Ag. Thus, the first portion 12a (see FIG. 14) illustrated in the above-described second modified example can be omitted, and only the second portion 12b can be used. Therefore, decrease in impedance can be further suppressed and matching of high-frequency signals can be further facilitated compared to the second modified example.

Fifth Modified Example

FIG. 21 is a view schematically illustrating a cross section including an input lead 5 of a package 1F according to a fifth modified example of the above-described embodiment. In the present modified example, an end edge 5a of the input lead 5 is positioned on an outer side of an inner lateral surface 4c when viewed from a normal direction of a main surface 3a. End edges of a joining material 8 that joins the input lead 5 to a side wall 4B and a printed wiring pattern 45 are also positioned on an outer side of the inner lateral surface 4c to be aligned with the end edge 5a of the input lead 5. Thus, in the present modified example, a portion of an upper surface 4b of the side wall 4B on the inner lateral surface 4c side is exposed.

As in the present modified example, the input lead 5 does not need to extend to the inner lateral surface 4c and may be at a position retreated from the inner lateral surface 4c.

Thereby, an area in which the input lead 5 and a conductive layer 11 face each other can be reduced. Thus, decrease in impedance can be suppressed and matching of high-frequency signals can be facilitated. A distance L3 between the end edge 5a of the input lead 5 and the inner lateral surface 4c may be, for example, 0.3 mm or less.

The semiconductor device package and the semiconductor device according to the present invention are not limited to the above-described embodiment and modified examples, and various other modifications can be made. For example, the above-described embodiment and modified examples may be combined with each other according to required purposes and effects. In the above-described embodiment and modified examples, the conductive layers 11 and 12 are provided only in the region overlapping the input lead 5 and the output lead 6, but the conductive layers 11 and 12 may be provided on the entire side wall 4A (or 4B). In the above-described embodiment, GaN-HEMT has been illustrated as an example of the semiconductor element, but it may be a lateral double-diffused MOS (LDMOS), a GaAs-FET, or a semiconductor element other than a transistor. The conductive layers 11 and 12 include both the first portions 11a and 12a and the second portions 11b and 12b in the second modified example, and the conductive layers 11 and 12 include only the second portions 11b and 12b in the fourth modified example, but the conductive layers 11 and 12 may be configured to include only the first portions 11a and 12a.

REFERENCE SIGNS LIST 1A, 1B, 1C, 1D, 1E, 1F Package
3 Base
3a main surface
4A, 4B Side wall
4a Bottom surface
4b Upper surface
4c Inner lateral surface
4d Outer lateral surface
5 Input lead
5a End edge
6 Output lead
7, 8, 9, 10 Joining material
11, 12 Conductive layer
11a, 12a First portion
11b, 12b Second portion
13, 14 Via
31, 33 Copper plate
32 Molybdenum plate
41, 42, 43, 44 Portion
45 Printed wiring pattern
71 Resin film
100 Semiconductor device
106 Input matching circuit
107 Semiconductor die
107a Short side
107b Long side
107c Substrate
107d Source electrode
107e Gate electrode
107f Source via
107g Active region
107h Drain electrode
107d Source electrode
108 Output matching circuit
109 Output capacitor
h1, h2, h3, h4, L3 Distance
D1, D2 Direction
L1, L2 Length
W1, W2 Width

The invention claimed is:

1. A semiconductor device package comprising:
a base having a main surface made of a metal;
a dielectric side wall having a bottom surface facing the main surface;
a joining material containing silver (Ag) and joining the main surface of the base and the bottom surface of the side wall to each other;
a lead made of a metal joined to an upper surface of the side wall on a side opposite to the bottom surface; and
a conductive layer not containing silver (Ag) provided between the bottom surface and the upper surface of the side wall at a position overlapping the lead when viewed from a normal direction of the main surface, electrically connected to the joining material, extending along the bottom surface, and exposed from a lateral surface of the side wall.

2. A semiconductor device package comprising:
a base having a main surface made of a metal;
a dielectric side wall having a bottom surface joined to the main surface;
a lead made of a metal facing an upper surface of the side wall on a side opposite to the bottom surface;
a joining material containing silver (Ag) and joining the lead and the upper surface of the side wall to each other; and
a conductive layer not containing silver (Ag) provided between the bottom surface and the upper surface of the side wall at a position overlapping the lead when viewed from a normal direction of the main surface, electrically connected to the joining material, extending along the upper surface, and exposed from a lateral surface of the side wall.

3. The semiconductor device package according to claim 1, wherein electrical connection between the conductive layer and the joining material is performed by a conductive via penetrating the side wall between the conductive layer and the joining material.

4. The semiconductor device package according to claim 1, wherein a distance between the bottom surface of the side wall and the conductive layer is smaller than a distance between the upper surface of the side wall and the conductive layer.

5. The semiconductor device package according to claim 1, wherein the dielectric is a ceramic, and the conductive layer has a laminated structure including a tungsten (W) layer and a nickel (Ni) layer.

6. The semiconductor device package according to claim 1, wherein the dielectric is a resin, and the conductive layer has a laminated structure including a copper (Cu) layer and a gold (Au) layer or a nickel (Ni) layer.

7. The semiconductor device package according to claim 1, wherein the conductive layer includes at least one of a first portion provided to be biased toward an inner lateral surface of the side wall and exposed from the inner lateral surface, and a second portion provided to be biased toward an outer lateral surface of the side wall and exposed from the outer lateral surface.

8. The semiconductor device package according to claim 7, wherein the conductive layer includes only the second portion.

9. A semiconductor device comprising:
the package according to claim 1; and
a semiconductor element mounted in the package, wherein the lead is electrically connected to the semiconductor element via wiring in the package, and a potential of the lead is lower than a potential of the main surface of the base.

10. A semiconductor device comprising:
the package according to claim 2; and
a semiconductor element mounted in the package,
wherein the lead is electrically connected to the semiconductor element via wiring in the package, and a potential of the lead is higher than a potential of the main surface of the base.

11. The semiconductor device package according to claim 2, wherein electrical connection between the conductive layer and the joining material is performed by a conductive via penetrating the side wall between the conductive layer and the joining material.

12. The semiconductor device package according to claim 2, wherein a distance between the upper surface of the side wall and the conductive layer is smaller than a distance between the bottom surface of the side wall and the conductive layer.

13. The semiconductor device package according to claim 2, wherein the dielectric is a ceramic, and the conductive layer has a laminated structure including a tungsten (W) layer and a nickel (Ni) layer.

14. The semiconductor device package according to claim 2, wherein the dielectric is a resin, and the conductive layer has a laminated structure including a copper (Cu) layer and a gold (Au) layer or a nickel (Ni) layer.

15. The semiconductor device package according to claim 2, wherein the conductive layer includes at least one of a first portion provided to be biased toward an inner lateral surface of the side wall and exposed from the inner lateral surface, and a second portion provided to be biased toward an outer lateral surface of the side wall and exposed from the outer lateral surface.

16. The semiconductor device package according to claim 15, wherein the conductive layer includes only the second portion.

* * * * *